United States Patent
Mitsui et al.

(10) Patent No.: US 12,002,914 B2
(45) Date of Patent: *Jun. 4, 2024

(54) SEMICONDUCTOR LIGHT-EMITTING ELEMENT AND SEMICONDUCTOR LIGHT-EMITTING DEVICE

(71) Applicant: Nuvoton Technology Corporation Japan, Kyoto (JP)

(72) Inventors: Yasutomo Mitsui, Toyama (JP); Yasumitsu Kunoh, Toyama (JP); Masanori Hiroki, Shiga (JP); Shigeo Hayashi, Kyoto (JP); Masahiro Kume, Toyama (JP); Masanobu Nogome, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 58 days.

This patent is subject to a terminal disclaimer.

(21) Appl. No.: 17/570,203

(22) Filed: Jan. 6, 2022

(65) Prior Publication Data
US 2022/0131060 A1   Apr. 28, 2022

Related U.S. Application Data

(63) Continuation of application No. 17/133,583, filed on Dec. 23, 2020, now Pat. No. 11,258,001, which is a
(Continued)

(30) Foreign Application Priority Data
Jun. 6, 2019   (JP) .................. 2019-106170

(51) Int. Cl.
*H01L 33/62* (2010.01)
*H01L 33/38* (2010.01)
*H01L 33/48* (2010.01)

(52) U.S. Cl.
CPC ............ *H01L 33/62* (2013.01); *H01L 33/382* (2013.01); *H01L 33/486* (2013.01)

(58) Field of Classification Search
CPC ..... H01L 33/62; H01L 33/382; H01L 33/486; H01L 33/647; H01L 33/64; H01L 33/38
See application file for complete search history.

(56) References Cited

U.S. PATENT DOCUMENTS 11,258,001 B2 * 2/2022 Mitsui ................... H01L 33/486
2007/0284607 A1 * 12/2007 Epler ...................... H01L 33/16
257/E33.013

(Continued)

FOREIGN PATENT DOCUMENTS

CN     102460744 A     5/2012
JP     2004-128258 A   4/2004
(Continued)

OTHER PUBLICATIONS

International Search Report (ISR) dated Aug. 18, 2020 in International (PCT) Application No. PCT/JP2020/019362, with English translation.
(Continued)

*Primary Examiner* — Su C Kim
(74) *Attorney, Agent, or Firm* — Rimon P.C.

(57) ABSTRACT

A semiconductor light-emitting element includes: a semiconductor stack including an n-type layer and a p-type layer and having at least one n exposure portion being a recess where the n-type layer is exposed; a p wiring electrode layer on the p-type layer; an insulating layer (i) continuously covering inner lateral surfaces of at least one n exposure portion and part of a top surface of the p wiring electrode layer and (ii) having an opening portion that exposes the n-type layer; an n wiring electrode layer disposed above the p-type layer and the p wiring electrode layer and in contact with the n-type layer in the opening portion; and at least one
(Continued)

first n connecting member connected to the n wiring electrode layer in at least one first n terminal region. The n wiring electrode layer and the p-type layer are disposed below at least one first n terminal region.

18 Claims, 35 Drawing Sheets

Related U.S. Application Data continuation of application No. PCT/JP2020/019362, filed on May 14, 2020.

(56) References Cited

U.S. PATENT DOCUMENTS

| | | |
|---|---|---|
| 2009/0065800 A1 | 3/2009 | Wirth et al. |
| 2009/0121241 A1 | 5/2009 | Keller et al. |
| 2009/0283787 A1 | 11/2009 | Donofrio et al. |
| 2010/0040899 A1 | 2/2010 | Nomura et al. |
| 2010/0264951 A1 | 10/2010 | Shioga et al. |
| 2011/0127568 A1 | 6/2011 | Donofrio et al. |
| 2013/0320382 A1 | 12/2013 | Kojima et al. |
| 2013/0341634 A1 | 12/2013 | Heikman et al. |
| 2015/0280093 A1 | 10/2015 | Tomita et al. |
| 2015/0349207 A1 | 12/2015 | Sogo et al. |
| 2015/0362165 A1* | 12/2015 | Chu ............... H01L 33/32 362/235 |
| 2016/0020353 A1* | 1/2016 | Chu ............... H01L 24/97 257/21 |
| 2016/0027978 A1 | 1/2016 | Shih |
| 2016/0240759 A1 | 8/2016 | Chae et al. |
| 2016/0315225 A1 | 10/2016 | Kageyama |
| 2018/0182929 A1 | 6/2018 | Ozeki et al. |
| 2018/0323346 A1 | 11/2018 | Lee et al. |
| 2019/0013441 A1 | 1/2019 | Hong et al. |

FOREIGN PATENT DOCUMENTS

| | | |
|---|---|---|
| JP | 2004-356129 A | 12/2004 |
| JP | 2007-523483 A | 8/2007 |
| JP | 2008-166645 A | 7/2008 |
| JP | 2008-169408 A | 7/2008 |
| JP | 2011-003565 A | 1/2011 |
| JP | 2012-114370 A | 6/2012 |
| JP | 2012-243849 A | 12/2012 |
| JP | 2016-009749 A | 1/2016 |
| JP | 2016-208012 A | 12/2016 |
| JP | 2017-139203 A | 8/2017 |
| JP | 2017-535052 A | 11/2017 |
| JP | 2018-107371 A | 7/2018 |
| JP | 2018-160683 A | 10/2018 |
| JP | 2019-503087 A | 1/2019 |
| WO | 2014/064871 A1 | 5/2014 |
| WO | 2020/054592 A1 | 3/2020 |

OTHER PUBLICATIONS

Japanese Office Action issued for the corresponding Japanese Patent Application No. 2020-202203, dated Mar. 9, 2021, with Englsih translation.
Office Action dated Jul. 23, 2021 Issued for the corresponding Chinese patent application No. 202080003367.2, with English translation of Search Report.
Japanese Office Action dated Jul. 6, 2021 issued for the corresponding Japanese Patent Application No. 2020-202203, with English translation.
Written Opinion dated Aug. 18, 2020 in International (PCT) Application No. PCTIJP2020/019362, with English translation.
Non-Final Office Action issued in U.S. Appl. No. 17/133,583, dated Mar. 18, 2021.
Final Office Action issued in U.S. Appl. No. 17/133,583, dated Jul. 15, 2021.
Notice of Allowance issued in U.S. Appl. No. 17/133,583, dated Oct. 6, 2021.

* cited by examiner

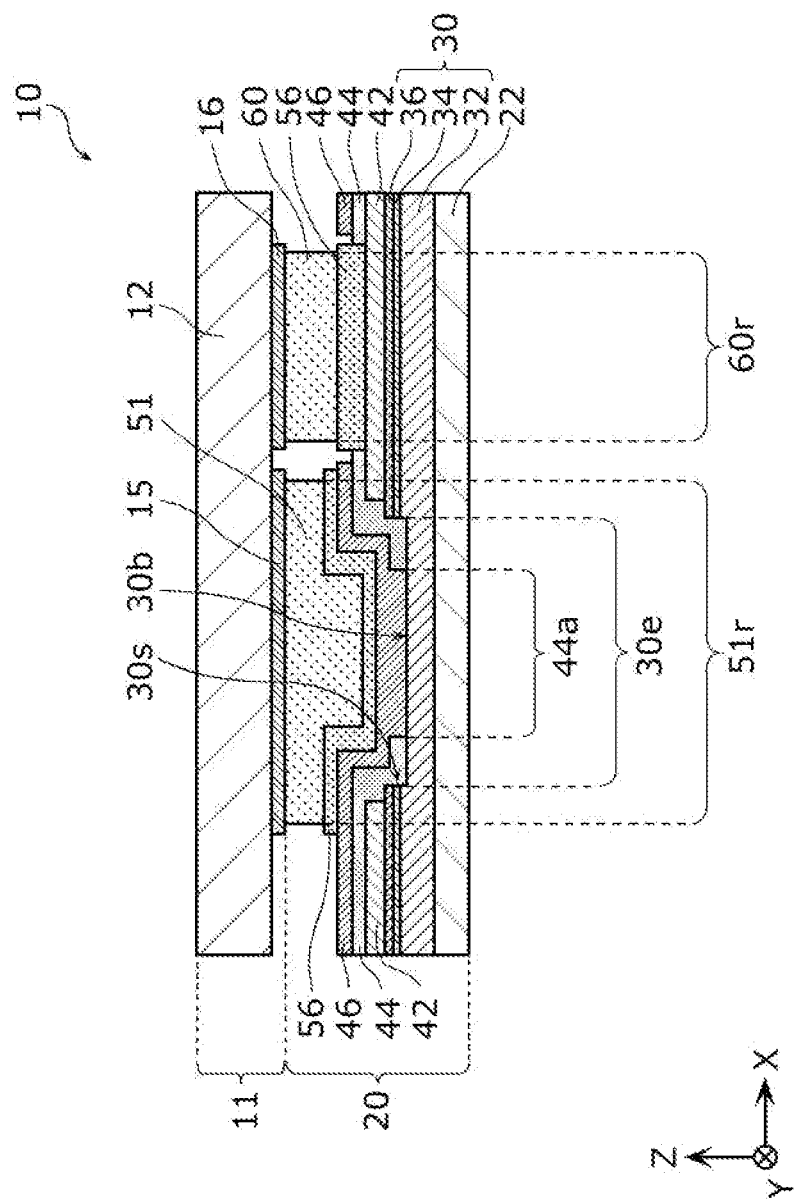

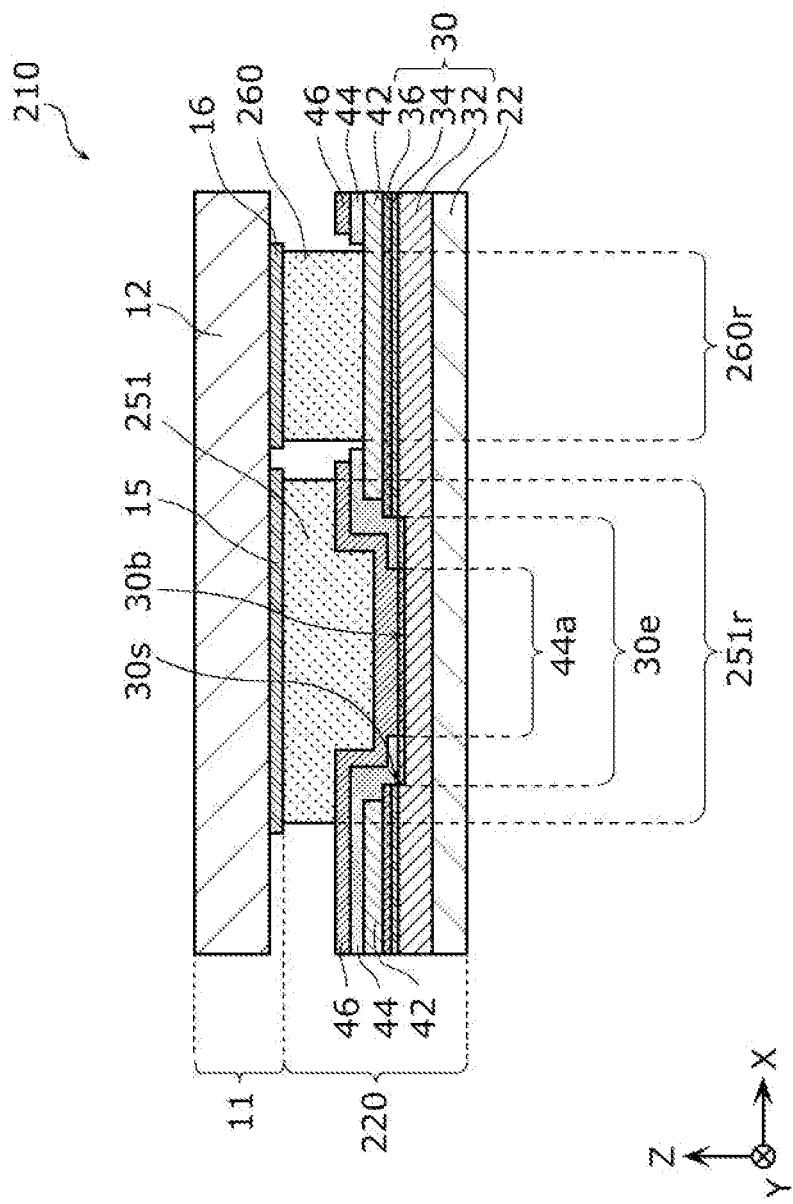

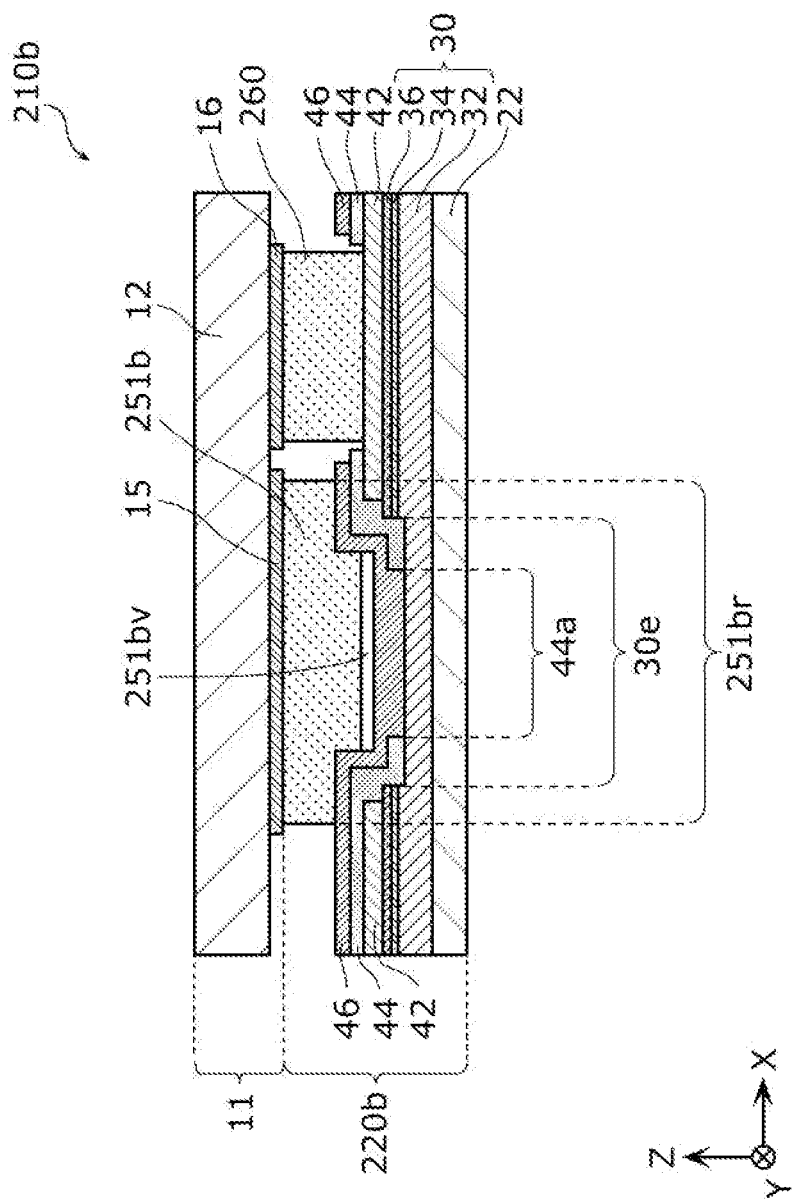

SEMICONDUCTOR LIGHT-EMITTING ELEMENT AND SEMICONDUCTOR LIGHT-EMITTING DEVICE

CROSS REFERENCE TO RELATED APPLICATIONS

This is a continuation application of U.S. application Ser. No. 17/133,583 filed on Dec. 23, 2020, which is a continuation application of PCT International Application No. PCT/JP2020/019362 filed on May 14, 2020, designating the United States of America, which is based on and claims priority of Japanese Patent Application No. 2019-106170 filed on Jun. 6, 2019. The entire disclosures of the above-identified applications, including the specifications, drawings and claims are incorporated herein by reference in their entirety.

FIELD

The present disclosure relates to a semiconductor light-emitting element and a semiconductor light-emitting device.

BACKGROUND

A conventional semiconductor light-emitting element to be flip-chip mounted, via bumps, on a wiring pattern formed on a mounting board is known (see, for example, Patent Literature (PTL) 1). A semiconductor light-emitting element described in PTL 1 has a structure in which a first semiconductor layer, a light-emitting layer, and a second semiconductor layer are sequentially stacked on a substrate, and exposure portions, at each of which the first semiconductor layer is exposed from the second semiconductor layer, are formed. The semiconductor light-emitting element also includes a second electrode and an insulating film sequentially stacked on the second semiconductor layer, and a first electrode stacked on the exposure portion and the insulating film. The semiconductor light-emitting element thus has a so-called two-layered wiring structure. Furthermore, in the semiconductor light-emitting element, bumps are disposed in high density directly under the light-emitting element to dissipate heat via the bumps. The bumps are disposed not to overlap the exposure portions so that the insulating film does not crack during the flip-chip mounting of the semiconductor light-emitting element.

CITATION LIST

Patent Literature

PTL 1: Japanese Unexamined Patent Application Publication No. 2018-107371

SUMMARY

Technical Problem

According to PTL 1, heat generated in the vicinity of the light-emitting layer of the semiconductor light-emitting element is dissipated to the mounting board via the bumps. The generated heat is conducted to the bumps via the insulating film having low thermal conductivity, heat dissipation is therefore low. Accordingly, with the semiconductor light-emitting element disclosed in PTL 1, reliability may be reduced particularly when a large amount of current is supplied to the semiconductor light-emitting element.

The present disclosure is conceived to overcome such a problem and provides a semiconductor light-emitting element and a semiconductor light-emitting device having high heat dissipation.

Solution to Problem

In order to solve the aforementioned problem, a semiconductor light-emitting element according to one aspect of the present disclosure includes: a semiconductor stack including an n-type layer, a light-emitting layer above the n-type layer, and a p-type layer above the light-emitting layer, the semiconductor stack having at least one n exposure portion which is a recess at which the n-type layer is exposed; a p wiring electrode layer on the p-type layer; an insulating layer that (i) continuously covers inner lateral surfaces of the at least one n exposure portion and part of a top surface of the p wiring electrode layer and (ii) has an opening portion that exposes the n-type layer at a bottom surface of the at least one n exposure portion; an n wiring electrode layer disposed above the p-type layer and the p wiring electrode layer via the insulating layer, the n wiring electrode layer being in contact with the n-type layer in the opening portion; at least one first n connecting member that is a conductive member for electric connection to an external conductor; a p connecting member in a region of the p wiring electrode layer, the region being exposed from the n wiring electrode layer and the insulating layer; and a void portion between the at least one first n connecting member and the n wiring electrode layer. The at least one first n connecting member is connected to the n wiring electrode layer in at least one first n terminal region. In a plan view, the at least one first n terminal region includes at least a portion of a region above the opening portion. The n wiring electrode layer and the p-type layer are disposed below the at least one first n terminal region in a cross section parallel to a stacking direction of the semiconductor stack.

By thus disposing the first n connecting member above the opening portion where the insulating layer having low thermal conductivity is not formed, it is possible to form a heat dissipation path not passing through the insulating layer. Accordingly, it is possible to enhance the heat dissipation of the semiconductor light-emitting element more than the case where the first n connecting member is disposed above the insulating layer. In the semiconductor light-emitting element, the amount of generated heat is large in the vicinity of the inner lateral surfaces of the n exposure portion. However, by disposing the first n connecting member above the inner lateral surfaces, it is possible to dissipate, via the first n connecting member, the heat generated in the vicinity of the inner lateral surfaces. Thus, it is possible to further enhance the heat dissipation of the semiconductor light-emitting element.

In the semiconductor light-emitting element according to one aspect of the present disclosure may further include at least one second n connecting member that is a conductive member for electric connection to an external conductor. The at least one second n connecting member is connected to the n wiring electrode layer in at least one second n terminal region for the n wiring electrode layer disposed in a location other than the at least one n exposure portion.

Thus, with the second n connecting member, it is possible to further enhance the heat dissipation of the semiconductor light-emitting element since an additional heat dissipation path can be formed.

In the semiconductor light-emitting element according to one aspect of the present disclosure, the at least one first n connecting member may be disposed apart from the at least one second n connecting member.

With the first n connecting member being disposed apart from the second n connecting member, it is possible to disperse a mounting load imposed in a vertical direction and thus inhibit cracks in the insulating layer.

In the semiconductor light-emitting element according to one aspect of the present disclosure, a grain size of the at least one first n connecting member may be larger than a grain size of the n wiring electrode layer.

By thus increasing the grain size of at least one first n connecting member to be larger than the grain size of the n wiring electrode layer, it is possible to make the first n connecting member less hard than the n wiring electrode layer. It is therefore possible to absorb, by at least one first n connecting member, a force imposed on the semiconductor light-emitting element when the semiconductor light-emitting element is mounted on a mounting board. Accordingly, with the semiconductor light-emitting element according to the present disclosure, it is possible to suppress a force imposed on the insulating layer in the vicinity of the inner lateral surfaces of the n exposure portion during the mounting more than the case where the grain size of at least one first n connecting member is the same as that of the n wiring electrode layer, and this inhibits cracks in the insulating layer.

In the semiconductor light-emitting element according to one aspect of the present disclosure may further include: a p connecting member in a region of the p wiring electrode layer, the region being exposed from the n wiring electrode layer and the insulating layer; and a seed metal layer between the at least one first n connecting member and the n wiring electrode layer and between the p connecting member and the p wiring electrode layer, the seed metal layer having a surface that is facing away from the semiconductor stack and is made of Au. The at least one first n connecting member and the p connecting member may be made of Au.

In the semiconductor light-emitting element according to one aspect of the present disclosure, the at least one first n connecting member may include a pair of an element-side n connecting member and a mounting-board-side n connecting member, and the p connecting member may include a pair of an element-side p connecting member and a mounting-board-side p connecting member. The element-side n connecting member may be disposed closer to the semiconductor stack than the mounting-board-side n connecting member is, and the element-side p connecting member may be disposed closer to the semiconductor stack than the mounting-board-side p connecting member is.

In order to solve the aforementioned problem, a semiconductor light-emitting element according to one aspect of the present disclosure includes: a semiconductor light-emitting element according to claim 1; and a mounting board including a first wiring electrode and a second wiring electrode. The at least one first n connecting member is bonded to the first wiring electrode of the mounting board, and the p wiring electrode layer is bonded, in a region, to the second wiring electrode of the mounting board via a p connecting member that is a conductive member, the region being exposed from the n wiring electrode layer and the insulating layer.

By thus disposing the first n connecting member above the opening portion where the insulating layer having low thermal conductivity is not formed, it is possible to form a heat dissipation path not passing through the insulating layer. Accordingly, it is possible to enhance the heat dissipation of the semiconductor light-emitting element more than the case where the first n connecting member is disposed above the insulating layer. In the semiconductor light-emitting element, the amount of generated heat is large in the vicinity of the inner lateral surfaces of the n exposure portion. However, by disposing the first n connecting member above the inner lateral surfaces, it is possible to dissipate, via the first n connecting member, the heat generated in the vicinity of the inner lateral surfaces. Thus, it is possible to further enhance the heat dissipation of the semiconductor light-emitting element.

In the semiconductor light-emitting element according to one aspect of the present disclosure, an edge portion of a bonding face, of the at least one first n connecting member, at which the at least one first n connecting member is bonded to the first wiring electrode of the mounting board, may be located inward of the first wiring electrode and away from an edge portion of the first wiring electrode.

By thus not disposing the first n connecting member at the edge portions of the first wiring electrode, it is possible to inhibit short circuits between the first n connecting member and a neighboring second wiring electrode and between the first n connecting member and a neighboring p connecting member.

In the semiconductor light-emitting element according to one aspect of the present disclosure, in the cross section parallel to the stacking direction, a grain size of the at least one first n connecting member above the opening portion may be larger than a grain size of the at least one first n connecting member above the p-type layer.

Such a distribution of the grain size of the first n connecting member is formed, for example, when a semiconductor light-emitting element is mounted on a mounting board. In the mounting of the semiconductor light-emitting element according to the present disclosure, FCB mounting is applied. The FCB mounting includes a weighting step and a step of applying ultrasonic sound waves after the weighting step. Since the opening portion is lower (i.e., recessed) than the surrounding p-type layer, when the first n connecting member is compressed in the weighting step, the compression rate of the first n connecting member above the surrounding p-type layer is higher than that above the opening portion. Accordingly, the first n connecting member above the surrounding p-type layer gets harder than that above the opening portion. For this reason, when the first n connecting member is bonded to the mounting board in the step of applying ultrasonic sound waves, the hardened first n connecting member above the surrounding p-type layer serves as an obstacle, thereby inhibiting the first n connecting member from expanding in a direction parallel to a stacking plane. Thus, it is possible to inhibit a short circuit between the first n connecting member and a neighboring p connecting member.

In the semiconductor light-emitting element according to one aspect of the present disclosure, in the cross section parallel to the stacking direction, a lateral wall of the at least one first n connecting member may expand more outwardly with closeness to the n wiring electrode layer.

Thus, the expansion of the lateral wall of the first n connecting member can increase the area of the first n terminal region more than the case where the lateral wall does not expand. It is therefore possible to dissipate heat in a wider area through the first n connecting member. Accordingly, it is possible to enhance the heat dissipation of the semiconductor light-emitting device.

In order to solve the aforementioned problem, a semiconductor light-emitting element according to one aspect of the present disclosure includes: a semiconductor stack including an n-type layer, a light-emitting layer above the n-type layer, and a p-type layer above the light-emitting layer, the semiconductor stack having at least one n exposure portion which is a recess at which the n-type layer is exposed; a p wiring electrode layer on the p-type layer; an insulating layer that (i) continuously covers inner lateral surfaces of the at least one n exposure portion and part of a top surface of the p wiring electrode layer and (ii) has an opening portion that exposes the n-type layer at a bottom surface of the at least one n exposure portion; and an n wiring electrode layer disposed above the p-type layer and the p wiring electrode layer via the insulating layer, the n wiring electrode layer being in contact with the n-type layer in the opening portion. At least one first n terminal region, in which a conductive member for electric connection to an external conductor is to be disposed, is set for the n wiring electrode layer. In a plan view, the at least one first n terminal region includes at least a portion of a region above the opening portion. The n wiring electrode layer and the p-type layer are disposed below the at least one first n terminal region in a cross section parallel to a stacking direction of the semiconductor stack.

By thus disposing the first n connecting member above the opening portion where the insulating layer having low thermal conductivity is not formed, it is possible to form a heat dissipation path not passing through the insulating layer. Accordingly, it is possible to enhance the heat dissipation of the semiconductor light-emitting element more than the case where the first n connecting member is disposed above the insulating layer. In the semiconductor light-emitting element, the amount of generated heat is large in the vicinity of the inner lateral surfaces of the n exposure portion. However, by disposing the first n connecting member above the inner lateral surface(s), it is possible to dissipate, via the first n connecting member, the heat generated in the vicinity of the inner lateral surface(s). Thus, it is possible to further enhance the heat dissipation of the semiconductor light-emitting element.

In the semiconductor light-emitting element according to one aspect of the present disclosure, in a plan view of the n wiring electrode layer, a total area of the at least one first n terminal region may be larger than a total area of the n wiring electrode layer disposed in a location other than the at least one n exposure portion.

By thus increasing the total area of at least one first n terminal region, it is possible to increase the number of heat dissipation paths when a conductive member is disposed in at least one first n terminal region. It is therefore possible to enhance the heat dissipation of the semiconductor light-emitting element.

In the semiconductor light-emitting element according to one aspect of the present disclosure, in a plan view of the n wiring electrode layer, an area of the at least one first n terminal region may be larger with closeness to an edge portion of the semiconductor light-emitting element.

Since a connecting member that could be a heat dissipation path is present only in an inward direction at the periphery of the semiconductor light-emitting element, as compared to the center portion thereof where such connecting member is present in all directions, heat dissipation could be reduced at the periphery of the semiconductor light-emitting element. However, in the semiconductor light-emitting element according to the present disclosure, it is possible to increase a heat dissipation path by increasing the area of a first n terminal region that is close to an edge portion of the semiconductor light-emitting element. It is therefore possible to enhance the heat dissipation at the periphery of the semiconductor light-emitting element.

In the semiconductor light-emitting element according to one aspect of the present disclosure, in a plan view of the n wiring electrode layer, an area of the opening portion may be larger with closeness to an edge portion of the semiconductor light-emitting element.

As described above, heat dissipation could be reduced at the periphery of a semiconductor light-emitting element. However, in the semiconductor light-emitting element according to the present disclosure, it is possible to increase a heat dissipation path while dispersing the source of heat generation, by increasing the area of an opening portion close to an edge portion of the semiconductor light-emitting element. It is therefore possible to enhance heat dissipation at the periphery of the semiconductor light-emitting element.

In the semiconductor light-emitting element according to one aspect of the present disclosure, in a plan view of the n wiring electrode layer, a center of the at least one first n terminal region may be placed in a region of the opening portion.

By thus placing the center of the first n terminal region in the region of the opening portion, the center portion of a conductive member such as the first n connecting member to be disposed in the first n terminal region is placed in the opening portion. Therefore, much of the force applied to the conductive member during mounting is imposed on the opening portion at which the insulating layer is not disposed. Accordingly, the force applied to the insulating layer during mounting can be suppressed, and this in turn makes it possible to inhibit cracks in the insulating layer.

In the semiconductor light-emitting element according to one aspect of the present disclosure, in a plan view of the n wiring electrode layer, a center of the at least one first n terminal region may coincide with a center of the opening portion.

By thus causing the center of the first n connecting member to coincide with the center of the opening portion, the center portion of a conductive member such as the first n connecting member to be disposed in the first n terminal region is placed at the center of the opening portion. Therefore, much of the force applied to the conductive member during mounting is imposed on the opening portion at which the insulating layer is not disposed. Accordingly, the force applied to the insulating layer during mounting can be suppressed, and this in turn makes it possible to inhibit cracks in the insulating layer. In the semiconductor light-emitting element according to one aspect of the present disclosure, at least one second n terminal region may be set above the n wiring electrode layer disposed in a location other than the at least one n exposure portion, the at least one second n terminal region being a region in which a conductive member for electric connection to an external conductor is to be disposed.

By thus setting the second n terminal region, it is possible to form an additional heat dissipation path when a conductive member is disposed in the second n terminal region. It is therefore possible to further enhance the heat dissipation of the semiconductor light-emitting element.

In the semiconductor light-emitting element according to one aspect of the present disclosure, in a plan view of the n wiring electrode layer, a total sum of areas of the at least one first n terminal region and the at least one second n terminal region may be greater than a total area of the n wiring electrode layer disposed in a location other than the at least one n exposure portion.

By thus increasing the areas of the first n terminal region and the second n terminal region, it is possible to increase the number of heat dissipation paths when conductive members are disposed in the first n terminal region and the second n terminal region. It is therefore possible to enhance the heat dissipation of the semiconductor light-emitting element.

Advantageous Effects

According to the present disclosure, it is possible to provide a semiconductor light-emitting element and a semiconductor light-emitting device having high heat dissipation.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2A is a schematic cross-sectional view illustrating the overall configuration of the semiconductor light-emitting device according to Embodiment 1.

FIG. 25C is a schematic cross-sectional view illustrating a third process in the manufacturing method of the semiconductor light-emitting device according to Embodiment 3.

FIG. 26B is a schematic cross-sectional view illustrating an overall configuration of a semiconductor light-emitting device according to another variation of Embodiment 3.

DESCRIPTION OF EMBODIMENTS

Figure 1:
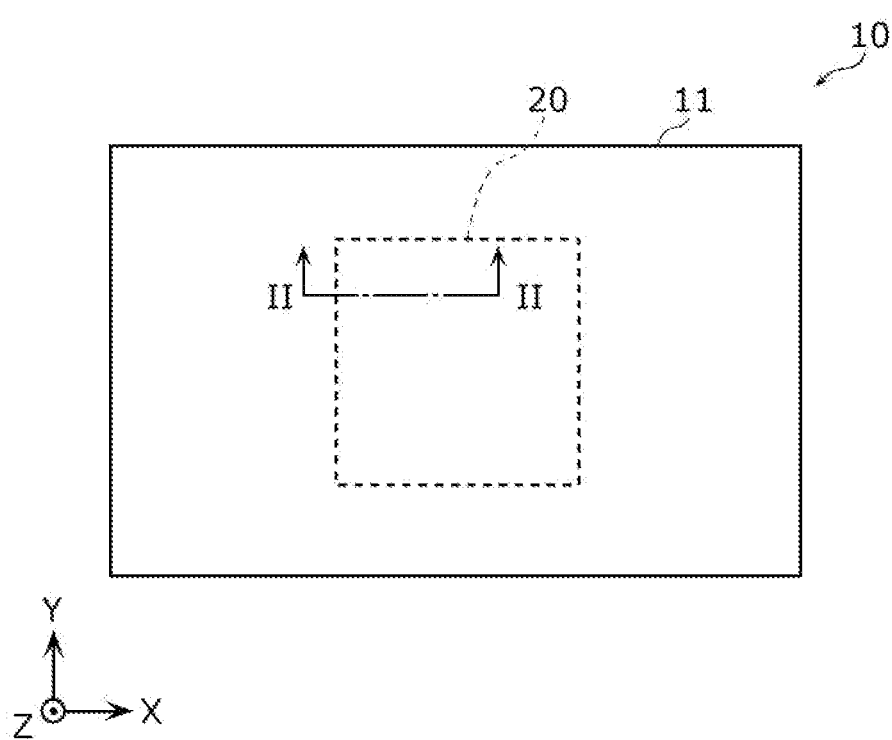
FIG. 1 is a schematic plan view illustrating an overall configuration of a semiconductor light-emitting device according to Embodiment 1.

Hereinafter, exemplary embodiments of the present disclosure will be described in detail with reference to the drawings. It should be noted that each of the subsequently described exemplary embodiments show a generic or specific example. Accordingly, the numerical values, shapes, materials, elements, the arrangement and connection of the elements, etc. indicated in the following exemplary embodiments are mere examples, and therefore are not intended to limit the present disclosure.

The drawings are presented schematically and are not necessarily precise illustrations. Accordingly, scales in the drawings are not necessarily the same. In addition, substantially like elements are assigned with like reference signs in the drawings, and redundant description is omitted or simplified.

The terms "above" and "below" used in the subsequent description do not indicate an upward direction (vertically upward) and a downward direction (vertically downward) in an absolute spatial recognition, respectively, and are each used as a term specifying a relative positional relationship based on the order of stacking layers in a layered structure. In addition, the terms "above" and "below" are applied not only to the case where two elements are disposed apart from each other and another element is disposed between the two elements, but also to the case where two elements are disposed in contact with each other.

A semiconductor light-emitting element and a semiconductor light-emitting device according to Embodiment 1 will be described.

[1-1. Overall Configuration]

First, an overall configuration of the semiconductor light-emitting element and the semiconductor light-emitting device according to this embodiment will be described with reference to FIG. 1 through FIG. 3. FIG. 1 and FIG. 2A are a schematic plan view and a schematic cross-sectional view, respectively, illustrating an overall configuration of semiconductor light-emitting device 10 according to this embodiment. FIG. 1 illustrates a plan view of semiconductor light-emitting element 20 and mounting board 11. FIG. 2A illustrates part of a cross-section of semiconductor light-emitting device 10 taken along the line II-II in FIG. 1. Note that a direction vertical to the principal surfaces of mounting board 11 is defined as a Z-axis direction and two directions that are vertical to the Z-axis direction and mutually vertical to each other are defined as an X-axis direction and a Y-axis direction in FIG. 1, FIG. 2A, and each of the other diagrams.

Semiconductor light-emitting device 10 is a light-emitting device that includes semiconductor light-emitting element 20, and includes mounting board 11 and semiconductor light-emitting element 20, as illustrated in FIG. 1 and FIG. 2A.

Mounting board 11 is a base on which semiconductor light-emitting element 20 is to be mounted, and includes board 12, first wiring electrode 15, and second wiring electrode 16, as illustrated in FIG. 2A.

Board 12 is a base of mounting board 11 and is a ceramic board formed of, for example, an AlN sintered body. First wiring electrode 15 and second wiring electrode 16 are conductive layers formed on board 12 and comprise, for example, Au. First wiring electrode 15 and second wiring electrode 16 are mutually isolated from each other.

Semiconductor light-emitting element 20 is a light-emitting element including a semiconductor layer and includes growth substrate 22, semiconductor stack 30, p wiring electrode layer 42, insulating layer 44, and n wiring electrode layer 46. In this embodiment, semiconductor light-emitting element 20 further includes seed metal layers 56, at least one first n connecting member 51, and p connecting member 60.

Growth substrate 22 is a substrate on which semiconductor stack 30 is stacked. In this embodiment, a sapphire substrate or a GaN substrate is used as a transmissive substrate for growth substrate 22.

Semiconductor stack 30 includes n-type layer 32, light-emitting layer 34, and p-type layer 36, as illustrated in FIG. 2A. Semiconductor stack 30 includes at least one n exposure portion 30e which is a recess at which n-type layer 32 is exposed. N exposure portion 30e includes bottom surface 30b which is a bottom of n exposure portion 30e and inner lateral surfaces 30s which are surfaces each extending from bottom surface 30b in a stacking direction in which the layers are stacked. The stacking direction is a direction vertical to the principal surfaces of growth substrate 22 (i.e., the Z-axis direction in each diagram). In this embodiment, n exposure portion 30e is a recess that is circular in shape and has the diameter of approximately 70 μm. The shape of n exposure portion 30e is not limited to circular and may be quadrilateral, for instance. The number of n exposure portions 30e may be, but not specifically limited to, at least one. For example, the number of n exposure portions 30e may be plural.

N-type layer 32 includes an n-type semiconductor layer disposed above growth substrate 22. In this embodiment, an n-type GaN-based layer is used as the n-type semiconductor layer for n-type layer 32. N-type layer 32 may include a plurality of layers including an n-type cladding layer.

Light-emitting layer 34 is an active layer disposed on n-type layer 32. In this embodiment, an InGaN-based layer is used for light-emitting layer 34.

P-type layer 36 includes a p-type semiconductor layer disposed above light-emitting layer 34. In this embodiment, a p-type GaN-based layer is used as the p-type semiconductor layer for p-type layer 36. P-type layer 36 may include a plurality of layers including a p-type cladding layer.

P wiring electrode layer 42 is a conductive layer disposed on p-type layer 36. In this embodiment, p wiring electrode layer 42 is a laminated body including an Ag layer having the thickness of 0.2 μm, a Ti layer having the thickness of 0.7 μm, and an Au layer having the thickness of 0.3 μm which are sequentially laminated on p-type layer 36. P wiring electrode layer 42 is bonded, via p connecting member 60 which is a conductive member, to second wiring electrode 16 of mounting board 11 in a region exposed from n wiring electrode layer 46 and insulating layer 44.

Insulating layer 44 comprises an insulating material, continuously covers inner lateral surfaces 30s of at least one n exposure portion 30e and part of the top surface of p wiring electrode layer 42, and has opening portion 44a that exposes n-type layer 32 at the bottom surface 30b of at least one n exposure portion 30e. In this embodiment, insulating layer 44 comprises $SiO_2$ having the thickness of 1.0 μm. In addition, opening portion 44a is an opening that is circular in shape and has the diameter of approximately 60 μm. The shape of opening portion 44a is not limited to circular and may be quadrilateral, for instance.

N wiring electrode layer 46 is a conductive layer that is disposed above p-type layer 36 and p wiring electrode layer 42 via insulating layer 44 and in contact with n-type layer 32 at opening portion 44. In this embodiment, n wiring electrode layer 46 is a laminated body including an Al layer having the thickness of 0.3 μm, a Ti layer having the thickness of 0.3 μm, and an Au layer having the thickness of 1.0 μm which are sequentially laminated from the semiconductor stack 30 side.

Seed metal layer 56 is a conductive layer that forms a base of first n connecting member 51 or p connecting member 60, and is disposed between first n connecting member 51 and n wiring electrode layer 46 and between p connecting member 60 and p wiring electrode layer 42. In this embodiment, a surface of seed metal layer 56, which is facing away from semiconductor stack 30, is made of Au. More specifically, seed metal layer 56 is a laminated body formed by laminating a Ti layer having the thickness of 0.1 μm and an Au layer having the thickness of 0.3 μm which are sequentially laminated from the semiconductor stack 30 side.

At least one first n connecting member 51 is a conductive member for electric connection to an external conductor. In this embodiment, at least one first n connecting member 51 is bonded to first wiring electrode 15 of mounting board 11. At least one first n connecting member 51 is connected to n wiring electrode layer 46 in at least one first n terminal region 51r. Stated differently, at least one first n terminal region 51r, which is a region in which a conductive member for electric connection to an external conductor is to be disposed, is set for n wiring electrode layer 46. At least one first n connecting member 51 may be a metal having thermal conductivity of at least 100 W/m/K. In this embodiment, a bump made of Au having thermal conductivity of at least 300 W/m/K is used as first n connecting member 51. Note that one of Au, Ag, Al, and Cu, or an alloy of any selected combination thereof may be used for first n connecting member 51 having thermal conductivity of at least 100 W/m/K. The numbers of first n connecting members 51 and first n terminal regions 51r may be, but not specifically limited to, at least one. For example, the numbers of first n connecting members 51 and first n terminal regions 51r may be plural.

At least one first n terminal region 51r includes at least a portion of a region above opening portion 44a. Moreover, n wiring electrode layer 46 and p-type layer 36 are disposed below at least one first n terminal region 51r in a cross section parallel to the stacking direction of semiconductor stack 30, as illustrated in FIG. 2A.

P connecting member 60 is a conductive member for electric connection to an external conductor. In this embodiment, p connecting member 60 is bonded to second wiring electrode 16 of mounting board 11. P connecting member 60 is connected to p wiring electrode layer 42 in p terminal region 60r. Stated differently, p terminal region 60r, which is a region in which a conductive member for electric connection to an external conductor is to be disposed, is set for p wiring electrode layer 42. In this embodiment, p connecting member 60 is a bump made of Au. The numbers of p connecting members 60 and p terminal regions 60r may be, but not specifically limited to, at least one. For example, the numbers of p connecting member 60 and p terminal regions 60r may be plural.

[1-2. Operations and Advantageous Effects]

Next, the operations and advantageous effects of semiconductor light-emitting element 20 and semiconductor light-emitting device 10 according to this embodiment will be described.

As described above, at least one first n terminal region 51r, which is a region in which first n connecting member 51 that is a conductive member for electric connection to an external conductor is to be disposed, is set for n wiring electrode layer 46 of semiconductor light-emitting element 20 according to this embodiment. At least one first n terminal region 51r includes at least a portion of a region above opening portion 44a.

Figure 2B:
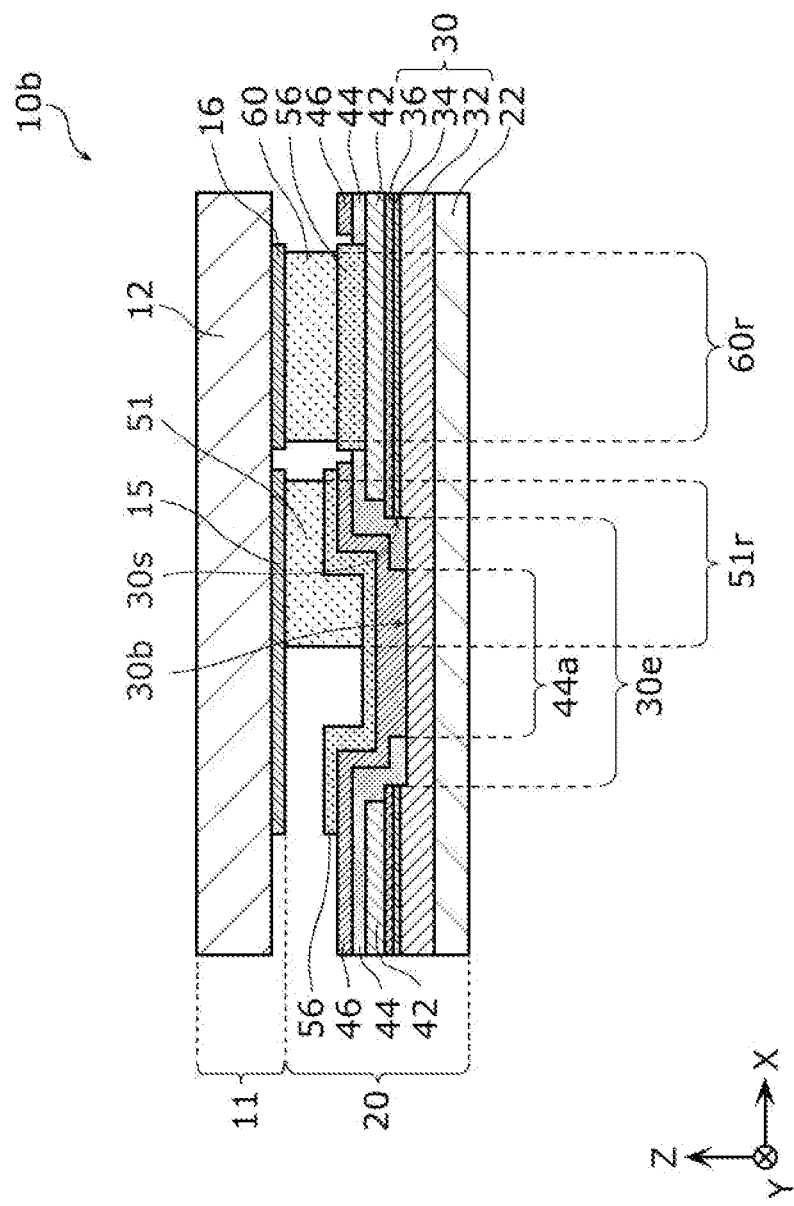
FIG. 2B is a schematic cross-sectional view illustrating an overall configuration of a semiconductor light-emitting device according to a variation of Embodiment 1.
Figure 3:
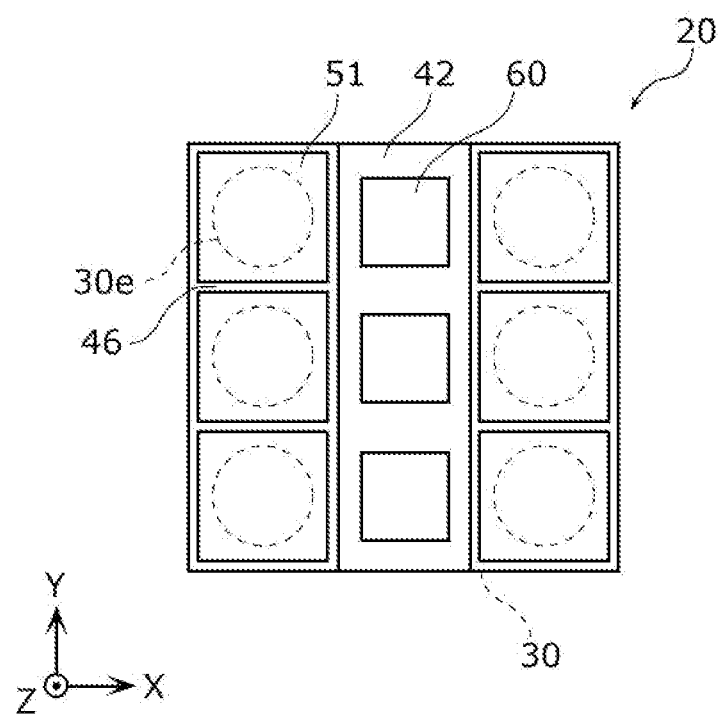
FIG. 3 is a schematic plan view illustrating a configuration of a semiconductor light-emitting element according to Embodiment 1.

Stated differently, first n terminal region 51r is disposed in the entire region above opening portion 44a in some cases, as illustrated in FIG. 2A, and is disposed only in part of the region above opening portion 44a in other cases. The case where first n terminal region 51r is disposed only in part of the region above opening portion 44a will be described with reference to FIG. 2B. FIG. 2B is a schematic cross-sectional view illustrating an overall configuration of semiconductor light-emitting device 10b according to a variation of this embodiment.

As illustrated in FIG. 2B, semiconductor light-emitting device 10b has first n terminal region 51r and first n connecting member 51 that are different from those in semiconductor light-emitting device 10, while the other elements are the same as those in semiconductor light-emitting device 10. In semiconductor light-emitting device 10b, first n terminal region 51r is provided only in part of the region above opening portion 44a. Stated differently, first n connecting member 51 is disposed only in part of the region above opening portion 44a.

By thus providing first n terminal region 51r for disposing a conductive member above opening portion 44a where insulating layer 44 having low thermal conductivity is not formed, it is possible to form a heat dissipation path not passing through insulating layer 44 when a conductive member is disposed in first n terminal region 51r. Accordingly, the heat dissipation of semiconductor light-emitting element 20 can be enhanced more than the case where a conductive member is disposed above insulating layer 44.

Even when part of opening portion 44a is exposed in at least one first n terminal region 51r of semiconductor light-emitting element 20, it is possible to dissipate, via first n connecting member 51, heat generated in the vicinity of an inner lateral surface of n exposure portion 30e (the right lateral surface of n exposure portion 30e in FIG. 2B), and this in turn makes it possible to enhance the heat dissipation of semiconductor light-emitting element 20.

In this embodiment, n wiring electrode layer 46 and p-type layer 36 are disposed below at least one first n terminal region 51r in a cross section parallel to the stacking direction of semiconductor stack 30. Although the amount of generated heat is large in the vicinity of inner lateral surfaces 30s of n exposure portion 30e in semiconductor light-emitting element 20, it is possible, by providing n terminal region 51r above inner lateral surface 30s, to dissipate the heat generated in the vicinity of inner lateral surface 30s of n exposure portion 30e when first n connecting member 51 is disposed as a conductive member in first n terminal region 51r. Accordingly, it is possible to further enhance the heat dissipation of semiconductor light-emitting element 20.

Figure 4:
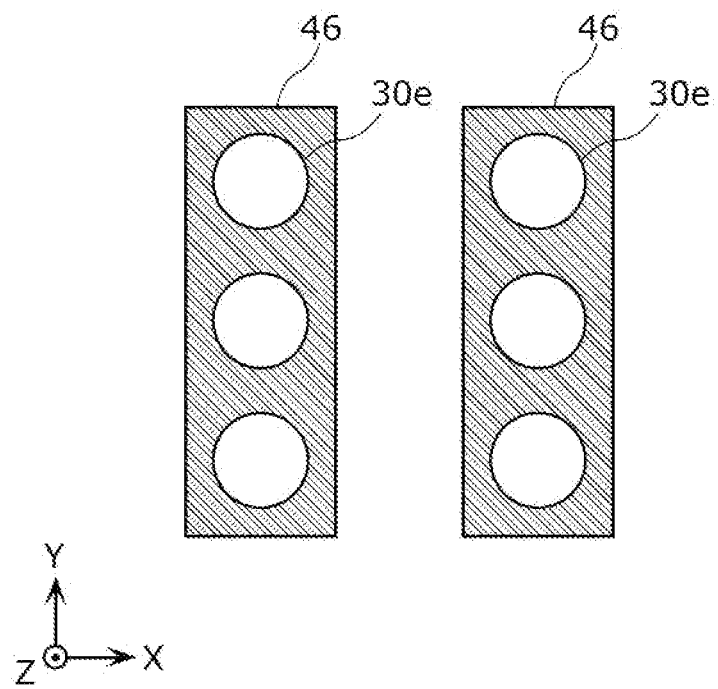
FIG. 4 is a plan view illustrating n wiring electrode layers each disposed at a location other than n exposure portions according to Embodiment 1.
Figure 5:
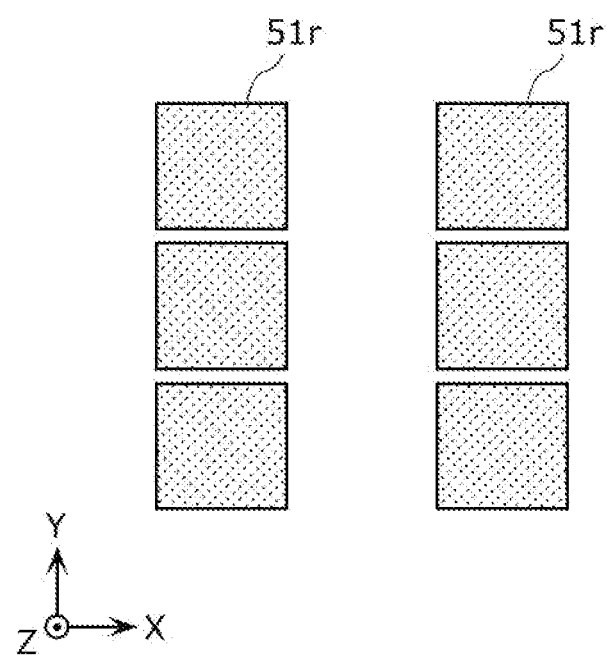
FIG. 5 is a plan view illustrating first n terminal regions according to Embodiment 1.

Subsequently, a configuration of at least one first n terminal region 51r of semiconductor light-emitting element 20 according to this embodiment will be described with reference to FIG. 3 through FIG. 5. FIG. 3 is a schematic plan view illustrating a configuration of semiconductor light-emitting element 20 according to this embodiment. FIG. 3 illustrates a plan view of n wiring electrode layer 46 of semiconductor light-emitting element 20. FIG. 4 is a plan view illustrating n wiring electrode layers 46 each disposed at a location other than n exposure portions 30e according to this embodiment. FIG. 5 is a plan view illustrating first n terminal regions 51r according to this embodiment.

In this embodiment, in the plan view of n wiring electrode layer 46, a total area of at least one first n terminal region 51r illustrated in FIG. 5 is larger than a total area of n wiring electrode layers 46 each disposed at a location other than n exposure portions 30e illustrated in FIG. 4.

By thus increasing the total area of first n terminal region 51r, it is possible to increase the number of heat dissipation paths when first n connecting member 51 is disposed in first n terminal region 51r. It is therefore possible to enhance the heat dissipation of semiconductor light-emitting element 20.

[1-3. Manufacturing Method]

Next, a method of manufacturing semiconductor light-emitting device 10 according to this embodiment will be described with reference to FIG. 6A through FIG. 6H. FIG. 6A through FIG. 6H are each a schematic cross-sectional view illustrating a process in the manufacturing method of semiconductor light-emitting device 10 according to this embodiment.

Figure 6A:
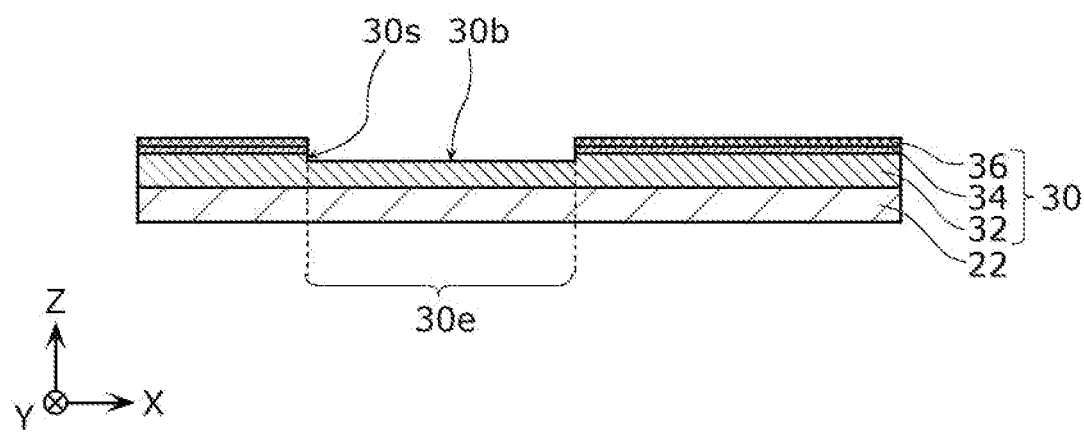
FIG. 6A is a schematic cross-sectional view illustrating a first process in a manufacturing method of the semiconductor light-emitting device according to Embodiment 1.

First, growth substrate 22 is prepared and semiconductor stack 30 is stacked on one of the principal surfaces of growth substrate 22, as illustrated in FIG. 6A. In this embodiment, n type layer 32 including an n-type GaN-based layer, light-emitting layer 34 including an InGaN-based layer, and p-type layer 36 including a p-type GaN-based layer are stacked in this order on one of the principal surfaces of growth substrate 22 formed of a sapphire substrate or a GaN substrate, using an epitaxial growth technique based on a metal organic chemical vapor deposition (MOCVD) method. Subsequently, p-type layer 36, light-emitting layer 34, and n-type layer 32 are partly removed to form at least one n exposure portion 30e which is a recess at which n-type layer 32 is exposed. In this embodiment, p-type layer 36, light-emitting layer 34, and a portion of n-type layer 32 are removed using dry etching.

Figure 6B:
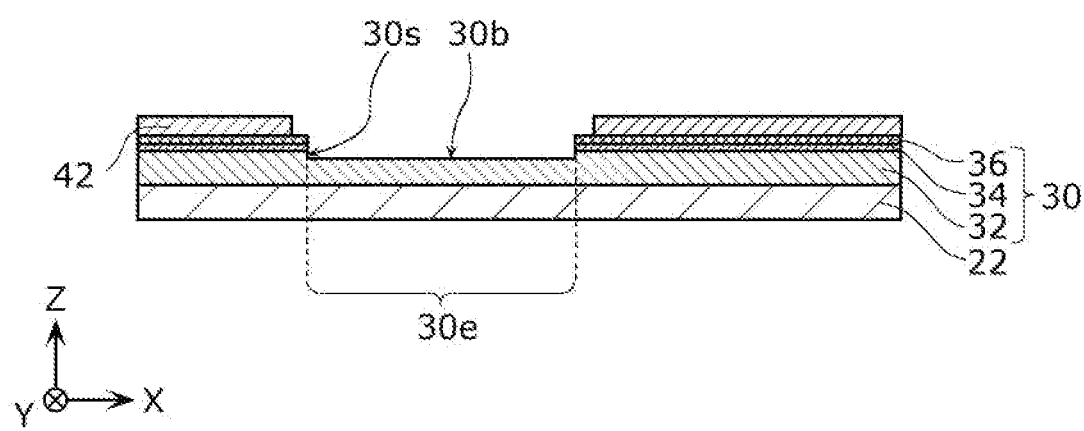
FIG. 6B is a schematic cross-sectional view illustrating a second process in the manufacturing method of the semiconductor light-emitting device according to Embodiment 1.

Subsequently, p wiring electrode layer 42 having a predetermined shape is formed on p-type layer 36, as illustrated in FIG. 6B. In this embodiment, a resist pattern provided with an opening in a region where p-type layer 36 is disposed is formed using a photolithography technique. Subsequently, an Ag layer having the thickness of 0.2 μm is formed using a sputtering method, and the Ag layer is formed as a reflective metal patterned into a predetermined shape by removing resist and Ag on the resist using a lift-off method. Subsequently, a laminated film including a Ti layer having the thickness of 0.7 μm and an Au layer having the thickness of 0.3 μm is formed using the sputtering method, to cover the Ag layer. A resist pattern covering p-type layer 36 is then formed using the photolithography technique, an unnecessary laminated film formed in a region other than p-type layer 36 is removed using wet etching, and resist is removed through organic cleaning. In this way, p wiring electrode layer 42 comprising the Ag layer, the Ti layer, and the Au layer is formed.

Figure 6C:
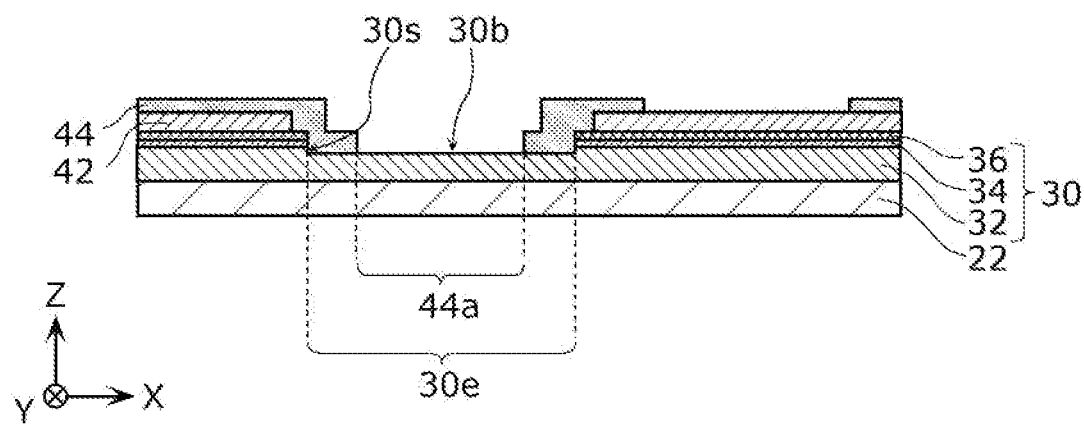
FIG. 6C is a schematic cross-sectional view illustrating a third process in the manufacturing method of the semiconductor light-emitting device according to Embodiment 1.

Subsequently, insulating layer 44 is formed as illustrated in FIG. 6C. In this embodiment, an oxide film comprising $SiO_2$ and having the thickness of 1.0 μm is formed on the entire surface of semiconductor stack 30 and p wiring electrode layer 42. A resist pattern which partly exposes n-type layer 32 and p-type layer 36 is then formed, and resist is removed after part of the oxide film at which the resist pattern is not formed is removed using wet etching. In this way, insulating layer 44, which is provided with opening portion 44a that exposes n-type layer 32 and with an opening that exposes p wiring electrode layer 42, is formed.

Figure 6D:
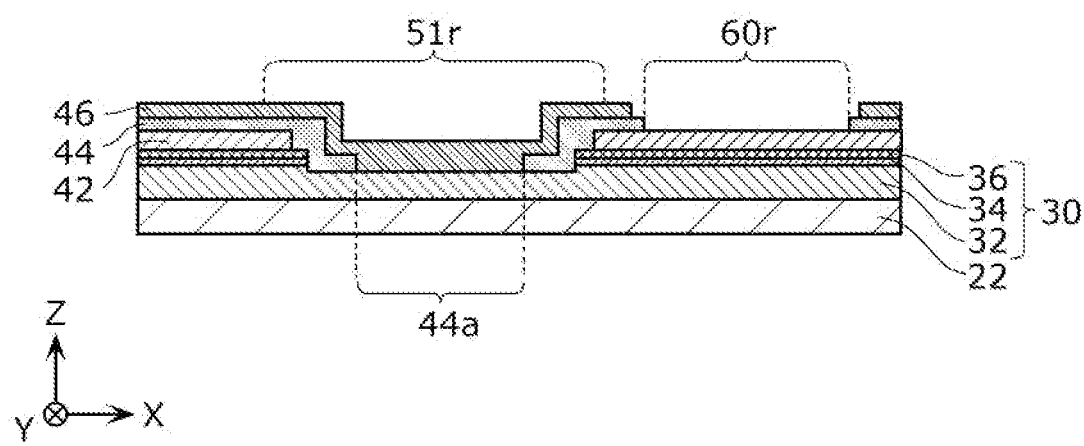
FIG. 6D is a schematic cross-sectional view illustrating a fourth process in the manufacturing method of the semiconductor light-emitting device according to Embodiment 1.

Subsequently, n wiring electrode layer 46 having a predetermined shape is formed on insulating layer 44 and opening portion 44a, as illustrated in FIG. 6D. In this embodiment, a resist pattern covering a region at which p wiring electrode layer 42 is exposed is formed. After a laminated film including an Al layer having the thickness of 0.3 μm, a Ti layer having the thickness of 0.3 μm, and an Au layer having the thickness of 1.0 μm is formed using an electron beam (EB) evaporation method, n wiring electrode layer 46 including the Al layer, the Ti layer, and the Au layer is formed by removing resist and the laminated film on the resist using the lift-off method. At least one first n terminal region 51r, which is a region in which at least one first n connecting member 51 that is a conductive member for electric connection to an external conductor is to be disposed, is set for n wiring electrode layer 46. Moreover, p terminal region 60r, which is a region in which p connecting member 60 that is a conductive member for electric connection to an external conductor is to be disposed, is set for a region at which p wiring electrode layer 42 is exposed.

Figure 6E:
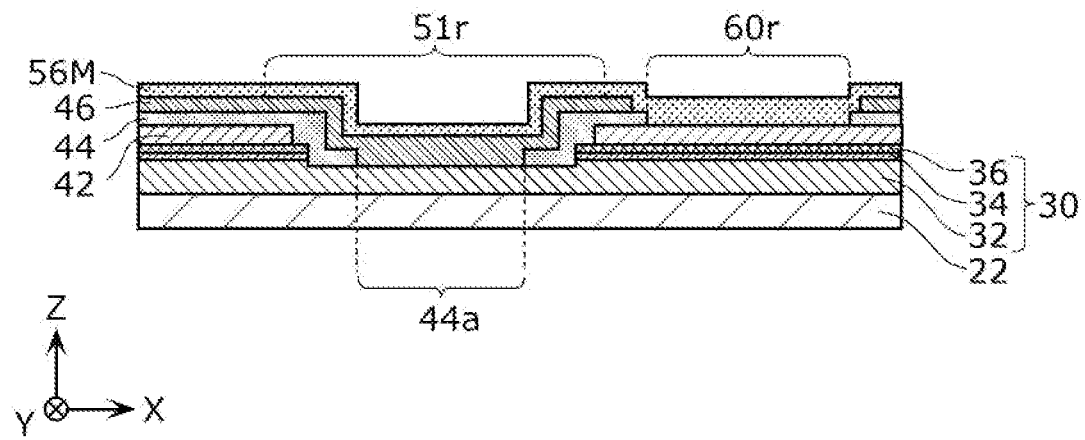
FIG. 6E is a schematic cross-sectional view illustrating a fifth process in the manufacturing method of the semiconductor light-emitting device according to Embodiment 1.

Subsequently, seed metal film 56M covering at least one first n terminal region 51r and p terminal region 60r is formed, as illustrated in FIG. 6E. In this embodiment, seed metal film 56M is formed by sequentially forming, using the EB method or the sputtering method, a Ti film and an Au film entirely over semiconductor stack 30, that is, over at least one first n terminal region 51r and p terminal region 60r.

Figure 6F:
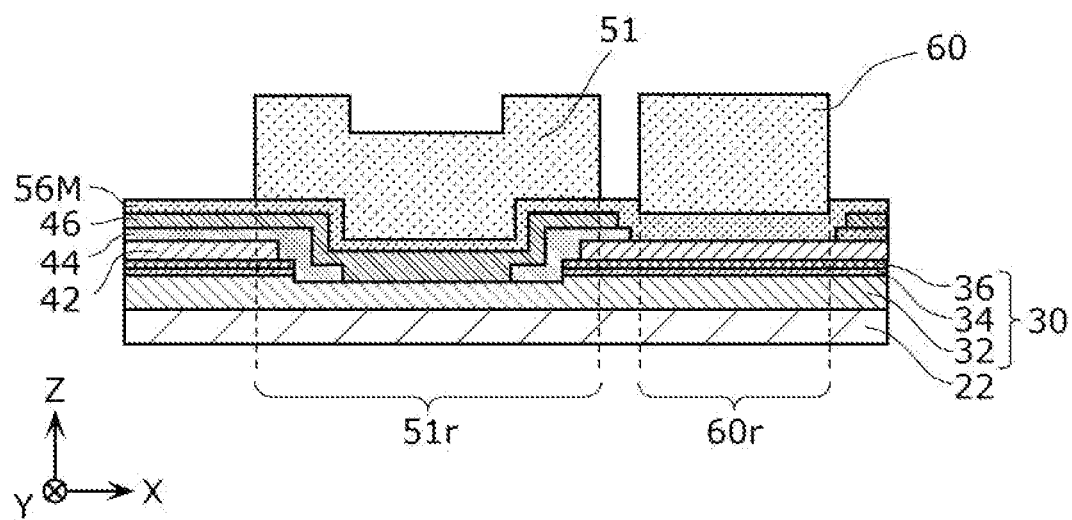
FIG. 6F is a schematic cross-sectional view illustrating a sixth process in the manufacturing method of the semiconductor light-emitting device according to Embodiment 1.

Subsequently, at least one first n connecting member 51 is formed in at least one first n terminal region 51r, as illustrated in FIG. 6F. In addition, p connecting member 60 is formed in p terminal region 60r. In this embodiment, a resist pattern which opens at least one first n terminal region 51r and p terminal region 60r is formed using the photolithography technique. After the formation of Au plating at the opening portions of the resist pattern through DC electroplating, resist is removed.

Figure 6G:
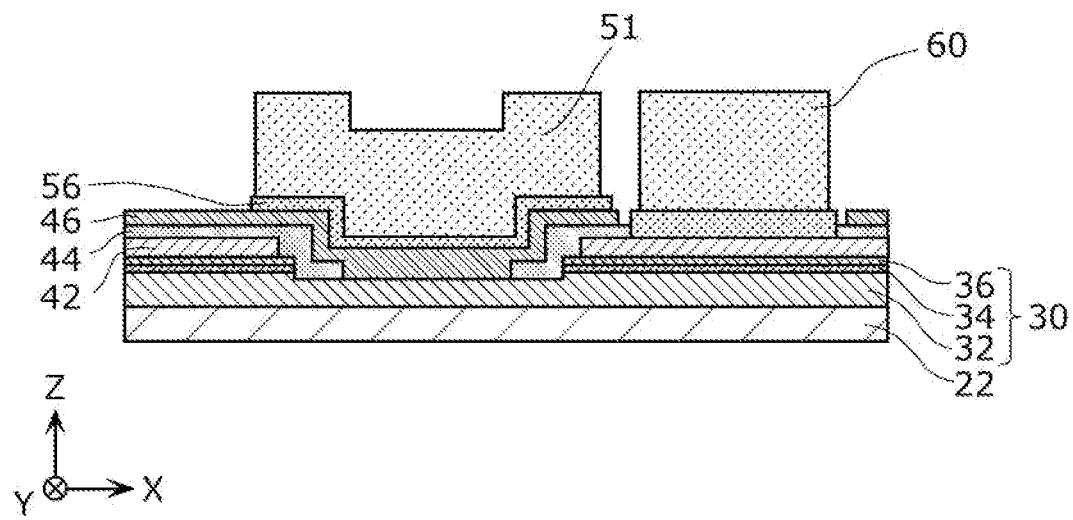
FIG. 6G is a schematic cross-sectional view illustrating a seventh process in the manufacturing method of the semiconductor light-emitting device according to Embodiment 1.

Subsequently, seed metal layer 56 is formed by removing the regions of seed metal film 56M on which at least one first n connecting member 51 and p connecting member 60 are not disposed, as illustrated in FIG. 6G. In this embodiment, seed metal film 56M is removed by selectively etching an Au film and a Ti film which form seed metal film 56M. In this way, seed metal layer 56 is formed.

Figure 6H:
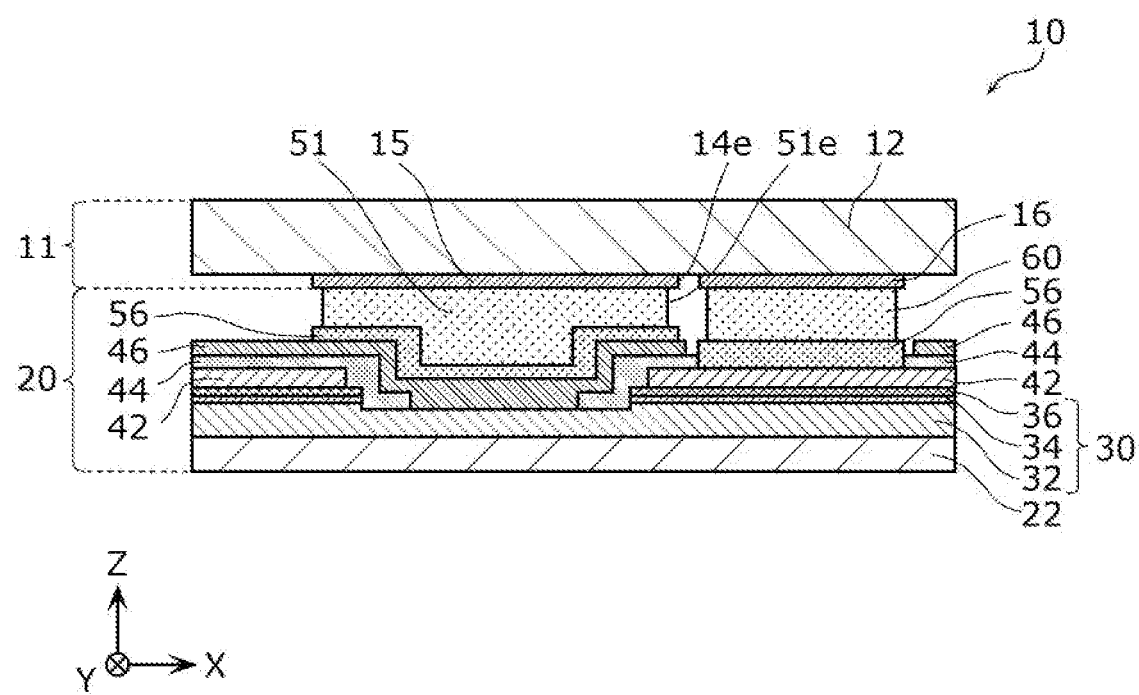
FIG. 6H is a schematic cross-sectional view illustrating an eighth process in the manufacturing method of the semiconductor light-emitting device according to Embodiment 1.

Subsequently, mounting board 11 is prepared and semiconductor light-emitting element 20 is flip-chip bonded to mounting board 11, as illustrated in FIG. 6H. In this embodiment, mounting board 11 is prepared by forming, on board 12, first wiring electrode 15 and second wiring electrode 16 each including an Au layer. At least one first n connecting member 51 and p connecting member 60 which are Au bumps of semiconductor light-emitting element 20 are bonded to first wiring electrode 15 and second wiring electrode 16, respectively. More specifically, semiconductor light-emitting element 20 is heated up to approximately 150 degrees Celsius while being pressed, with load, against mounting board 11, so that ultrasonic vibrations operate. With this, at least one first n connecting member 51 and p connecting member 60 are solid-phase bonded to first wiring electrode 15 and second wiring electrode 16, respectively, and are thus consolidated.

Semiconductor light-emitting device 10 according to this embodiment is manufactured as described above.

[1-4. Configurations of First n Connection Member and First n Terminal Region]

Figure 7:
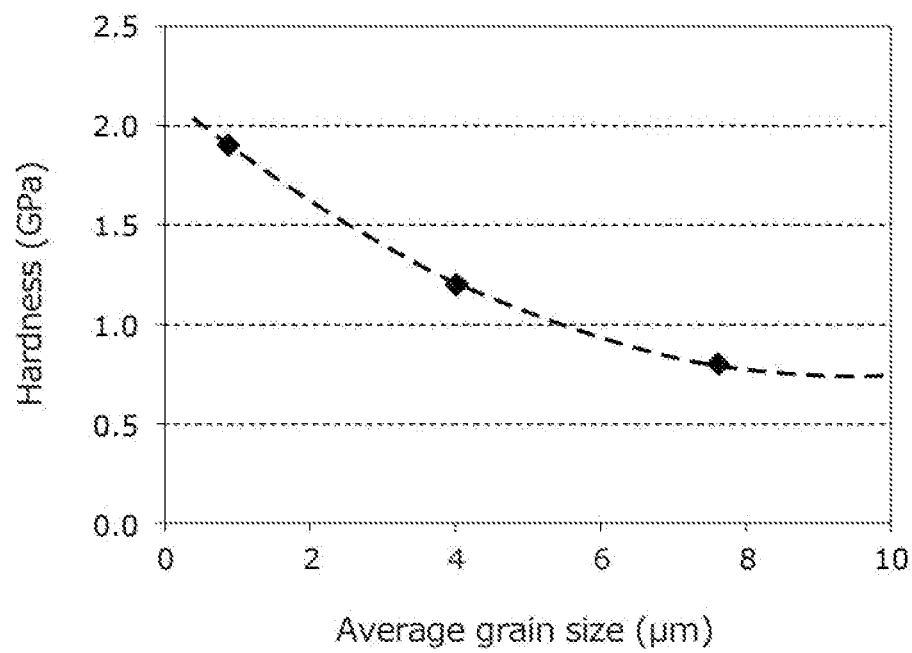
FIG. 7 is a graph representing a relationship between an average grain size and hardness of Au.
Figure 8:
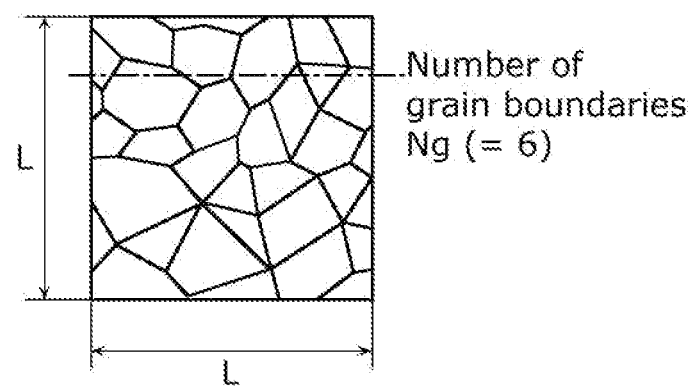
FIG. 8 is a diagram for explaining a method for measuring a grain size.
Figure 9:
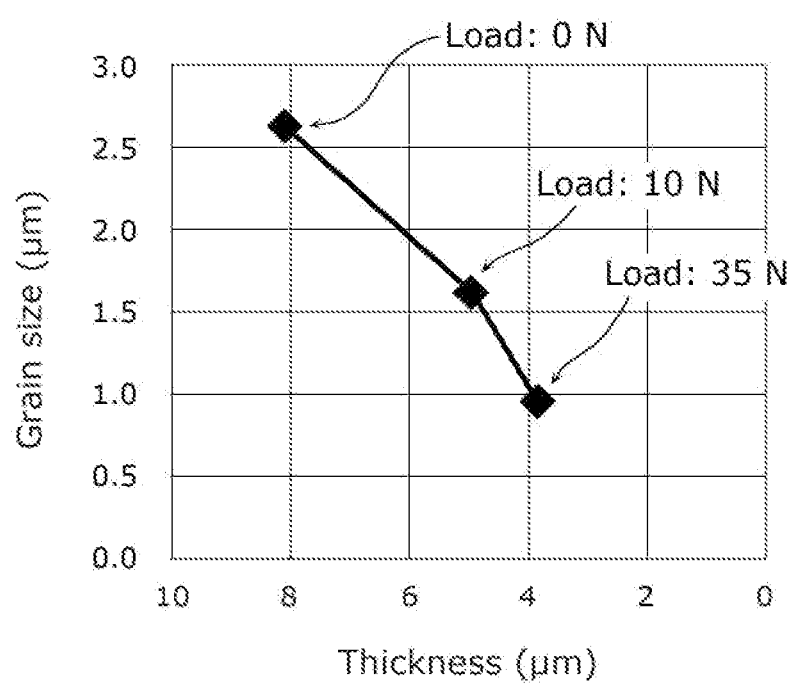
FIG. 9 is a graph representing a relationship between the grain size of a first n connecting member and the thickness of the first n connecting member when the first n connecting member is pressed and deformed, according to Embodiment 1.

Next, the configurations of first n connecting member 51 and first n terminal region 51r in semiconductor light-emitting device 10 manufactured using the above-described manufacturing method will be described. First, a grain size and hardness of first n connecting member 51 will be described with reference to FIG. 7 through FIG. 9. FIG. 7 is a graph representing a relationship between an average grain size and hardness of Au. FIG. 8 is a diagram for explaining a method for measuring a grain size. FIG. 9 is a graph representing a relationship between the grain size of first n connecting member 51 and the thickness of first n connecting member 51 when first n connecting member 51 is pressed and deformed.

As illustrated in FIG. 7, the hardness of first n connecting member 51 decreases with an increase in the average size of grains in first n connecting member 51. In general, there is a negative correlation between a grain size and hardness of a metal.

This attributes to the fact that the hardness of a metal is determined by an amount of plastic deformation caused when a load is imposed on the metal. The amount of plastic deformation is affected by obstacles against multiplication and migration of dislocation, slip plane length, and metal crystal orientation.

A metal crystal having a large grain size has a long slip line. A force thus concentrates at a crystalline interface when the force is applied on the metal crystal, thereby easily causing plastic deformation in the vicinity of the crystalline interface. In other words, a metal crystal having a large grain size is soft.

The following indicates a method used in this embodiment for measuring the size of grains in first n connecting member 51. In this embodiment, after the formation of a cross section of first n connecting member 51 for observation, a grain size is measured by applying an intercept method to an observed region observed in a scanning ion microscopy image (SIM image) using a scanning electronic microscopy.

When Ng number of crystals each having average grain size d are present per side in a square having side L, as illustrated in FIG. 8, the area of the square is expressed by $L^2$ and the area of one crystal grain is expressed by $\pi(d/2)^2$. When an observed region is relatively large with respect to a crystal grain, $Ng^2$ number of crystal grains are present in the square. Therefore, the area occupied by all the crystal grains is expressed by $Ng^2 \times \pi(d/2)^2$ and the area of the square equals the area occupied by all the crystal grains, resulting in $L^2 = Ng^2 \times \pi(d/2)^2$. When expressed by d, this can be expressed by a relational expression $d = 2 L/Ng/(\pi)^{1/2}$. A straight line (the dash-dotted line in FIG. 8) was drawn to the observed region L×L using this relational expression, and average grain size d of first n connecting member 51 was derived where the number of grain boundaries crossing the straight line was defined as the number Ng of crystals. In FIG. 8, since the dash-dotted straight line crosses six grain boundaries, Ng=6.

As illustrated in FIG. 9, given that the thickness of first n connecting member 51 is approximately 8 μm and the size of grains in first n connecting member 51 is approximately 2.6 μm when a load imposed on first n connecting member 51 is 0 N, the thickness is approximately 5 μm and the grain size is approximately 1.6 μm when the load is 10 N. When the load imposed on first n connecting member 51 is 35 N, the thickness is approximately 3.8 μm and the grain size is approximately 0.9 μm. In this way, the size of the grains in first n connecting member 51 decreases with an increase of the load imposed thereon. According to the graph shown in FIG. 7, when the size of the grains in first n connecting member 51 decreases, the hardness of the crystal grains increases. By thus pressing and deforming first n connecting member 51 at the time of mounting, the grain size of first n connecting member 51 decreases and the hardness of the grains increases. In this embodiment, the height of at least one first n connecting member 51 above opening portion 44a is lower than the height above p-type layer 36, before mounting, in a cross section parallel to the stacking direction of semiconductor stack 30, as illustrated in FIG. 6F. In other words, at least one first n connecting member 51 above opening portion 44a is recessed. For this reason, when semiconductor light-emitting element 20 is mounted on mounting board 11, the grain size of at least one first n connecting member 51 above p-type layer 36 is smaller than that above opening portion 44a. Accordingly, the grain size of at least one first n connecting member 51 above opening portion 44a is larger than that above p-type layer 36 in the cross section parallel to the stacking direction of semiconductor stack 30 in semiconductor light-emitting element 20 according to this embodiment.

Moreover, the grain size of at least one first n connecting member 51 that is an Au plated layer is larger than the grain size of n wiring electrode layer 46 including an Au layer formed using the EB evaporation method.

By thus increasing the grain size of at least one first n connecting member 51 to be larger than that of n wiring electrode layer 46, it is possible to reduce the hardness of at least one first n connecting member 51 to be less than that of n wiring electrode layer 46. It is therefore possible to absorb a force applied to semiconductor light-emitting element 20 by at least one first n connecting member 51 when semiconductor light-emitting element 20 is mounted on mounting board 11. Accordingly, it is possible, with semiconductor light-emitting element 20 according to this embodiment, to inhibit cracks in insulating layer 44 since a force applied to insulating layer 44 in the vicinity of the inner lateral surfaces of n exposure portion 30e during the mounting can be suppressed more than the case where the grain size of at least one first n connecting member 51 is the same as that of n wiring electrode layer 46.

Figure 10:
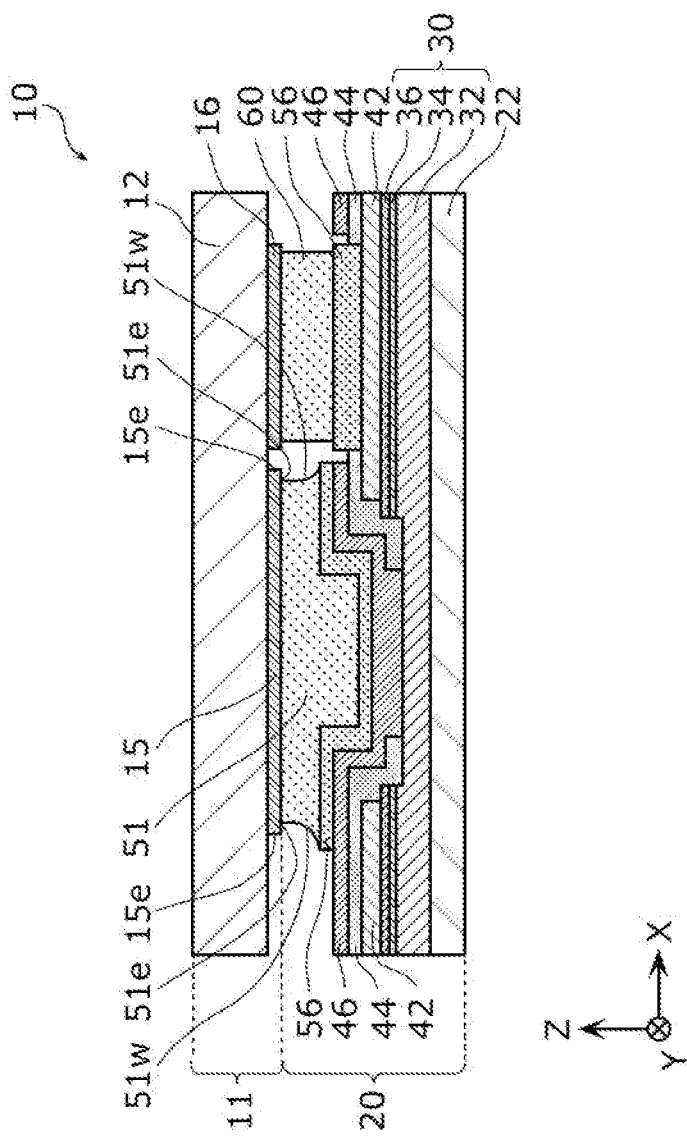
FIG. 10 is a schematic cross-sectional view illustrating a structure of the first n connecting member of the semiconductor light-emitting device according to Embodiment 1.

Next, a structure of at least one first n connecting member 51 according to this embodiment will be described with reference to FIG. 10. FIG. 10 is a schematic cross-sectional view illustrating the structure of first n connecting member 51 of semiconductor light-emitting device 10 according to this embodiment.

As illustrated in FIG. 10, edge portion 51e of a bonding face, of first n connecting member 51, on which first n connecting member 51 is bonded to first wiring electrode 15 is placed inward of first wiring electrode 15 away from edge portion 15e of first wiring electrode 15 of mounting board 11. Stated differently, edge portion 51e of the bonding face does not extend to edge portion 15e of first wiring electrode 15.

Thus, with first n connecting member 51 not being disposed at edge portion 15e of first wiring electrode 15, it is possible to inhibit short circuits between first n connecting member 51 and neighboring second wiring electrode 16 and between first n connecting member 51 and neighboring p connection member 60.

Such a structure of first n connecting member 51 can be achieved by pressing and deforming first n connecting member 51 to be bonded to first wiring electrode 15, as described above. In contrast, in the case of melting first n connecting member 51 to be bonded to first wiring electrode 15 using solder having a low melting point, first n connecting member 51 that has been melted expands to edge portion 15e of first wiring electrode 15. This easily causes short circuits between first n connecting member 51 and second wiring electrode 16 and between first n connecting member 51 and p connecting member 60.

Moreover, when at least one first n connecting member 51 is observed at a cross section parallel to the stacking direction of semiconductor stack 30, lateral walls 51w may expand outwardly with closeness to n wiring electrode layer 46, as illustrated in FIG. 10. In other words, at least one first n connecting member 51 may have a filet formed on the n wiring electrode layer 46 side.

In this way, the expansion of lateral walls 51w of first n connecting member 51 can increase the area of first n terminal region 51r more than the case where lateral walls 51w do not expand. It is therefore possible to dissipate heat in a wider area through first n connecting member 51. Accordingly, it is possible to enhance the heat dissipation of semiconductor light-emitting device 10.

The shapes of lateral walls 51w of first n connecting member 51 as illustrated in FIG. 10 can be formed using, for example, the manufacturing method which will be described below.

First, after the formation of the semiconductor light-emitting element as illustrated in FIG. 6G, heat treatment is conducted on the semiconductor light-emitting element at the temperature of 150 degrees Celsius for an hour in the atmosphere. This allows re-crystallization of first n connecting member 51 and n wiring electrode layer 46, thereby increasing the grain sizes of first n connecting member 51 and n wiring electrode layer 46. When first n connecting member 51 subjected to such a heat treatment is pressed to mounting board 11 to be bonded thereto, first n connecting member 51 in a region close to n wiring electrode layer 46 in which the grain size is large is less hard than that in a region close to mounting board 11, and therefore is pressed and deformed more heavily. Accordingly, lateral walls 51w of first n connecting member 51 in the region close to n wiring electrode layer 46 expand more outwardly than lateral walls 51w in the region close to mounting board 11 do. Thus, the shapes of lateral walls 51w of first n connecting member 51 as illustrated in FIG. 10 can be achieved.

Figure 11A:
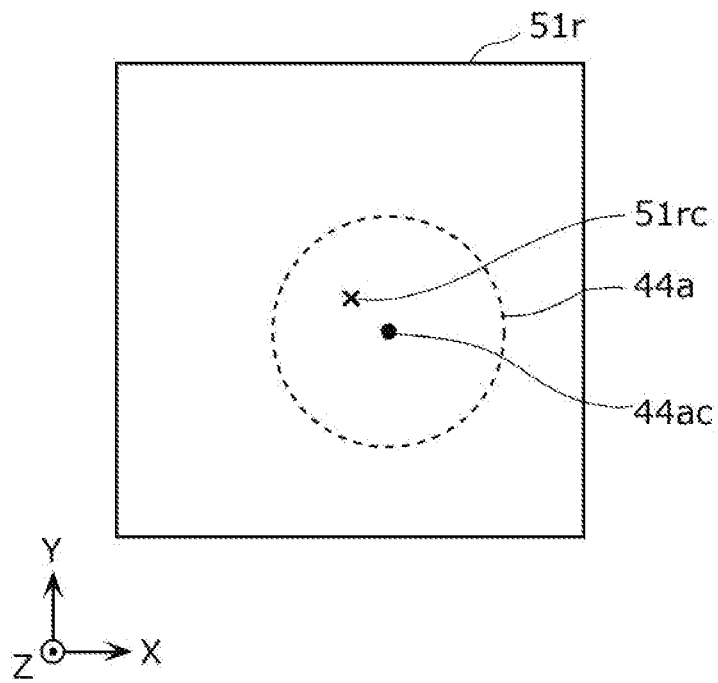
FIG. 11A is a plan view illustrating a first positional relationship between a first n terminal region and an opening portion according to Embodiment 1.
Figure 11B:
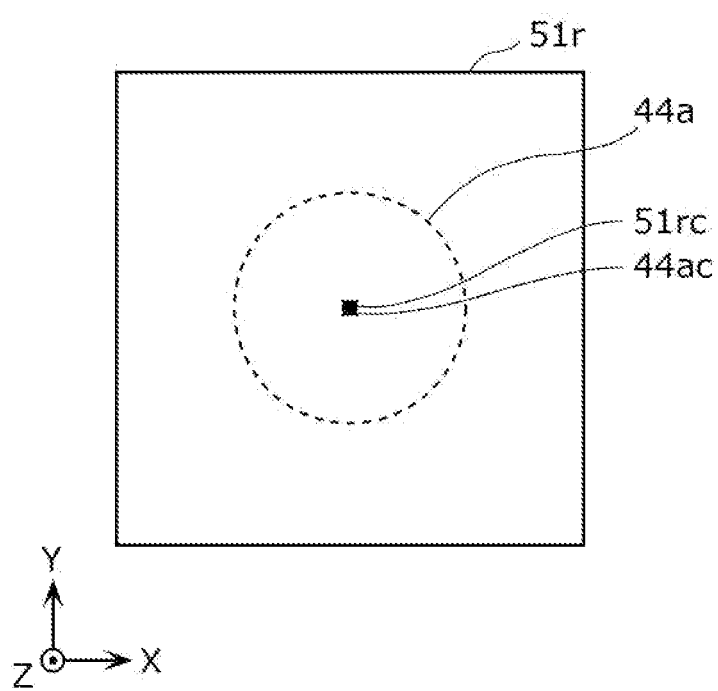
FIG. 11B is a plan view illustrating a second positional relationship between the first n terminal region and the opening portion according to Embodiment 1.

Next, at least one n terminal region 51r which is a region in which at least one first n connecting member 51 is to be disposed above n wiring electrode layer 46 according to this embodiment will be described with reference to FIG. 11A and FIG. 11B. FIG. 11A and FIG. 11B are each a plan view illustrating a positional relationship between first n terminal region 51r and opening portion 44a in the plan view of n wiring electrode layer 46.

As illustrated in FIG. 11A, center 51rc of first n terminal region 51r is in the region of opening portion 44a in the plan view of n wiring electrode layer 46.

By thus disposing center 51rc of first n terminal region 51r in the region of opening portion 44a, the center portion of a conductive member such as first n connecting member 51 to be disposed in first n terminal region 51r is placed at opening portion 44a. Therefore, much of a force applied to the conductive member during mounting is imposed on opening portion 44a at which insulating layer 44 is not disposed. Accordingly, the force applied to insulating layer 44 during mounting can be suppressed, and this in turn makes it possible to inhibit cracks in insulating layer 44. Note that when the shape of first n terminal region 51r is a circle, center 51rc of first n terminal region 51r is the center of the circle. When the shape of first n terminal region 51r is not a circle, the center of the gravity of first n terminal region 51r, for example, may be determined as center 51rc of first n terminal region 51r.

Moreover, in the plan view of n wiring electrode layer 46, center 51rc of n terminal region 51r may coincide with center 44ac of opening portion 44a, as illustrated in FIG. 11B.

By thus causing center 51rc of first n connecting member 51 to coincide with center 44ac of opening portion 44a, the center portion of a conductive member such as first n connecting member 51 to be disposed in first n terminal region 51r is placed at center 44ac of opening portion 44a. Therefore, much of a force applied to the conductive member during mounting is imposed on opening portion 44a at which insulating layer 44 is not disposed. Accordingly, the force applied to insulating layer 44 during mounting can be suppressed, and this in turn makes it possible to inhibit cracks in insulating layer 44.

Note that when the shape of opening portion 44a is not a circle, the center of the gravity of opening portion 44a may be determined as center 44ac of opening portion 44a, as is the case of center 51rc of first n terminal region 51r. The state specified by the terminology "center 51rc coincides with center 44ac" includes not only a state in which center 51rc totally coincides with center 44ac, but also a state in which these centers substantially coincide with each other. The aforementioned state includes, for example, a state in which a distance between center 51rc and center 44ac is at most approximately 5% of the maximum size of opening portion 44a.

[1-5. Variation 1]

Figure 12:
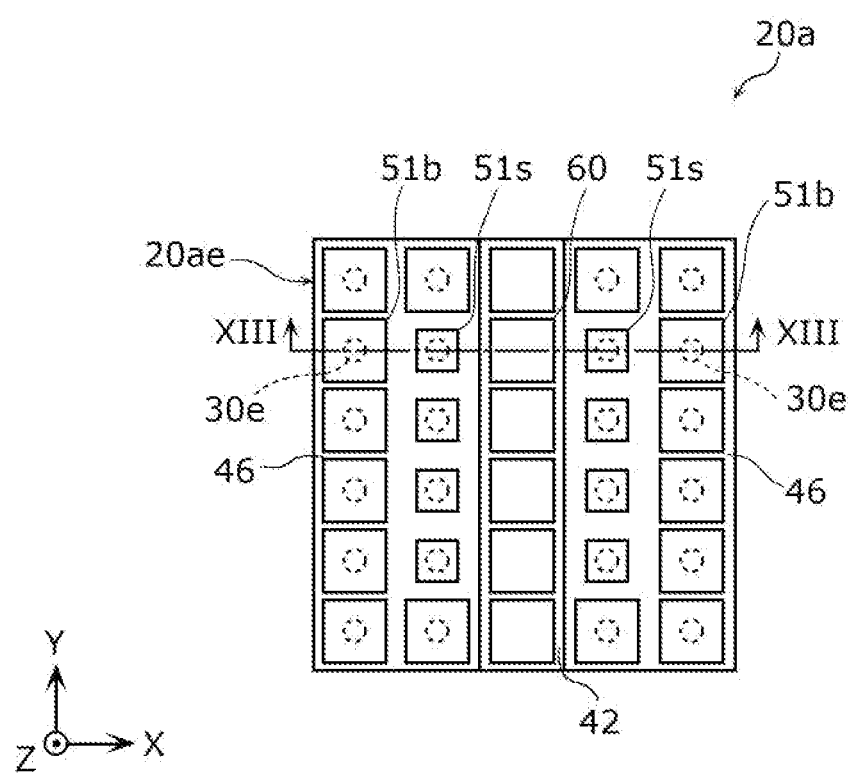
FIG. 12 is a plan view illustrating a configuration of a semiconductor light-emitting element according to Variation 1 of Embodiment 1.
Figure 13:
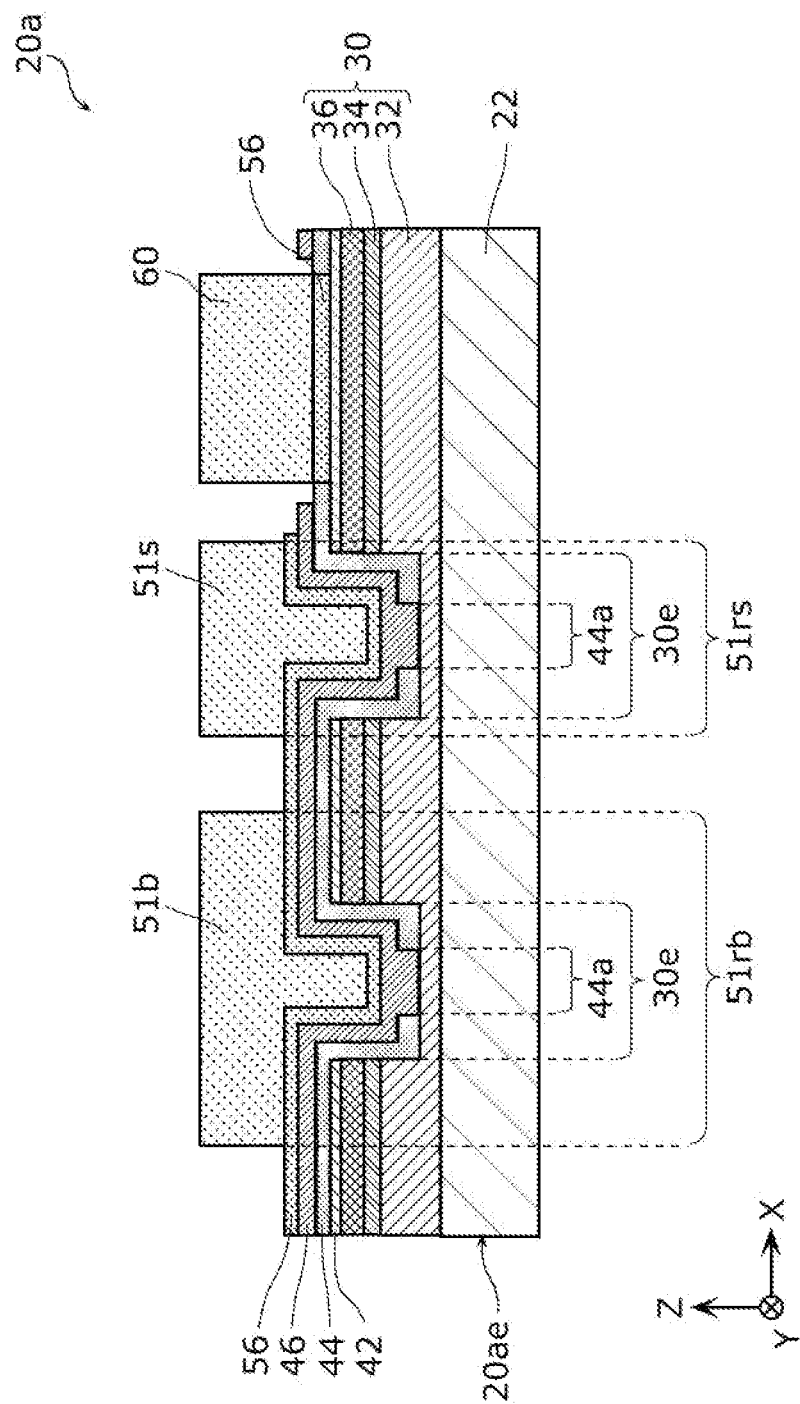
FIG. 13 is a cross-sectional view illustrating the configuration of the semiconductor light-emitting element according to Variation 1 of Embodiment 1.

Next, a semiconductor light-emitting element according to Variation 1 of this embodiment will be described with reference to FIG. 12 and FIG. 13. FIG. 12 and FIG. 13 are a plan view and a cross-sectional view, respectively, illustrating the configuration of semiconductor light-emitting element 20a according to this variation. FIG. 12 illustrates a plan view of n wiring electrode layer 46 of semiconductor light-emitting element 20a. FIG. 13 illustrates part of a cross section taken along the line XIII-XIII in FIG. 12.

As illustrated in FIG. 12 and FIG. 13, semiconductor light-emitting element 20a according to this variation includes first n connecting members 51b and 51s having different sizes, which is different from semiconductor light-emitting element 20 according to Embodiment 1. In semiconductor light-emitting element 20a, first n terminal regions 51rb and 51rs are set for first n connecting members 51b and 51s, respectively. In the plan view of n wiring electrode layer 46 of semiconductor light-emitting element 20a, an area of one first n terminal region increases with closeness to edge portion 20ae of semiconductor light-emitting element 20a. In FIG. 12 or FIG. 13, the area of first n terminal region 51rb that is close to edge portion 20ae of semiconductor light-emitting element 20a is larger than the area of first n terminal region 51rs that is more distant from edge portion 20ae than first n terminal region 51rb is.

Since a connecting member that could be a heat dissipation path is present only in an inward direction at the periphery of semiconductor light-emitting element 20a, as compared to the center portion where such connecting member is present in all directions, heat could be less dissipated at the periphery of semiconductor light-emitting element 20a. However, in semiconductor light-emitting element 20a according to this variation, it is possible to increase a heat dissipation path by increasing the area of first n terminal region 51rb that is close to edge portion 20ae, and this in turn makes it possible to enhance the heat dissipation at the periphery of semiconductor light-emitting element 20a.

[1-6. Variation 2]

Figure 14:
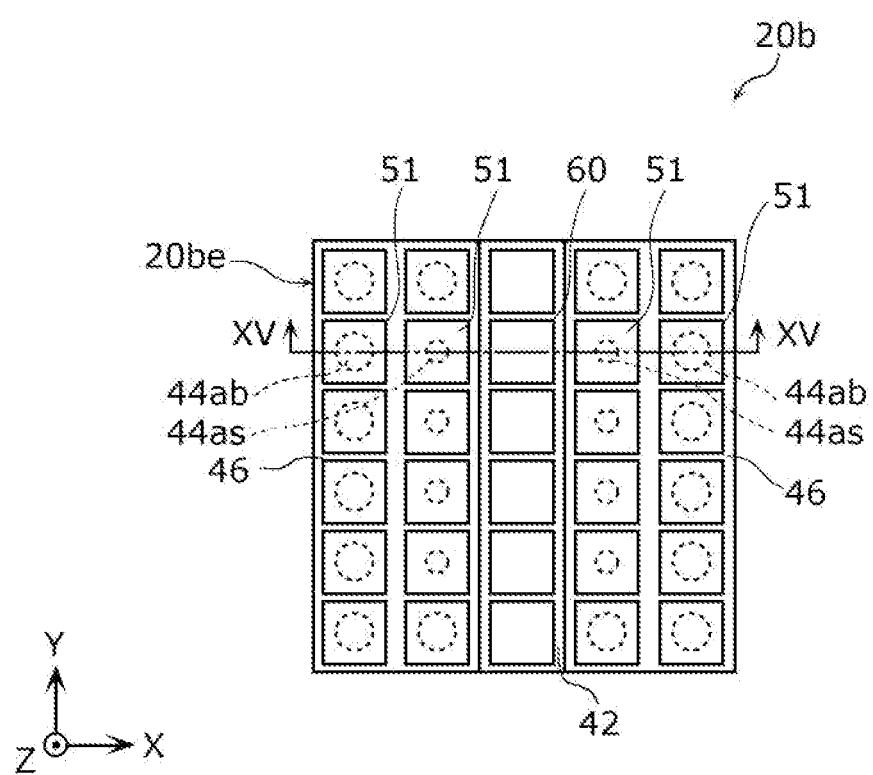
FIG. 14 is a plan view illustrating a configuration of a semiconductor light-emitting element according to Variation 2 of Embodiment 1.
Figure 15:
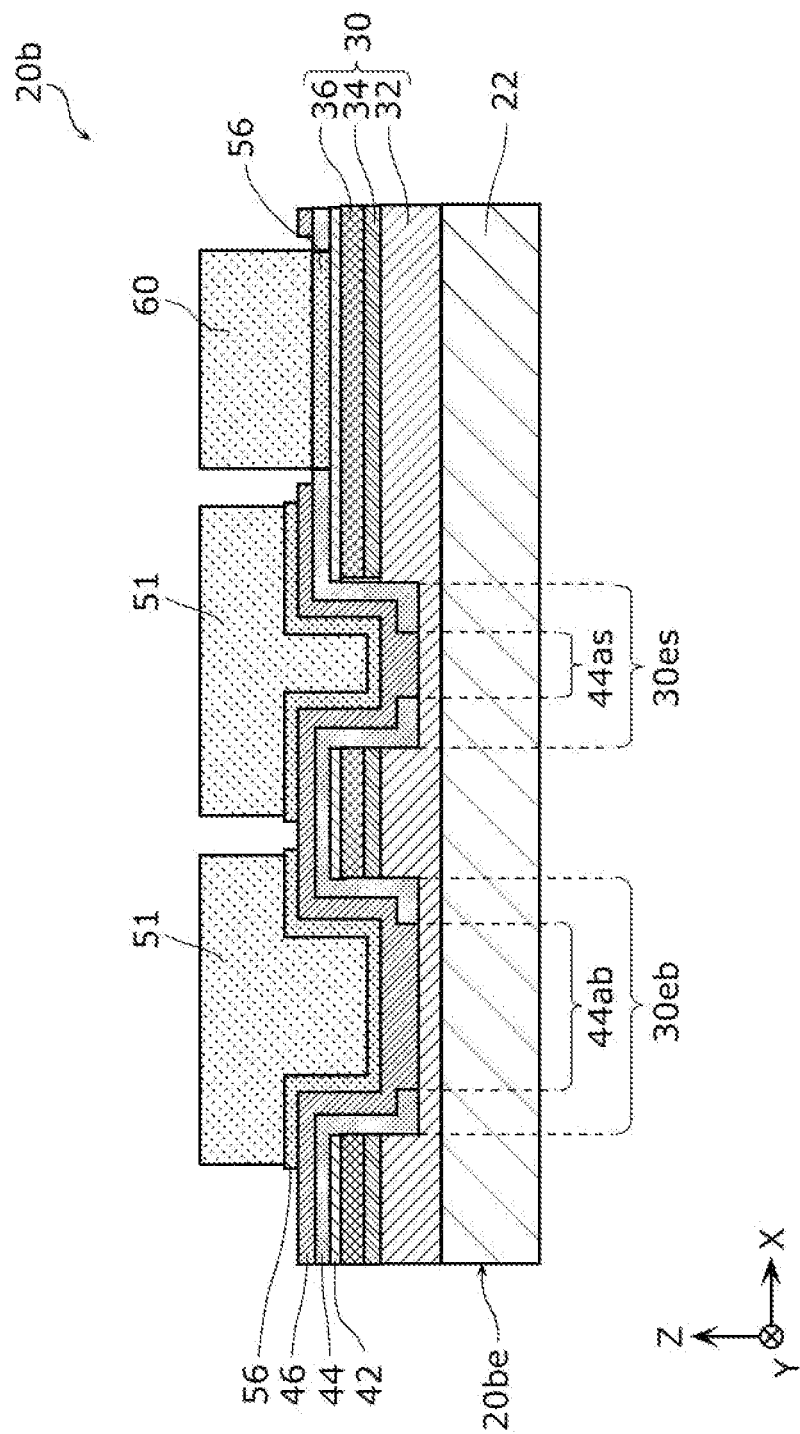
FIG. 15 is a cross-sectional view illustrating the configuration of the semiconductor light-emitting element according to Variation 2 of Embodiment 1.

Next, a semiconductor light-emitting element according to Variation 2 of this embodiment will be described with reference to FIG. 14 and FIG. 15. FIG. 14 and FIG. 15 are a plan view and a cross-sectional view, respectively, illustrating the configuration of semiconductor light-emitting element 20b according to this variation. FIG. 14 illustrates a plan view of n wiring electrode layer 46 of semiconductor light-emitting element 20b. FIG. 15 illustrates part of a cross section taken along the line XV-XV in FIG. 14.

As illustrated in FIG. 14 and FIG. 15, semiconductor light-emitting element 20b according to this variation includes opening portions 44ab and 44as having different sizes, which is different from semiconductor light-emitting element 20 according to Embodiment 1.

In the plan view of n wiring electrode layer 46 of semiconductor light-emitting element 20b, the area of one opening portion increases with closeness to edge portion 20be of semiconductor light-emitting element 20b. In FIG. 14 or FIG. 15, the area of opening portion 44ab that is close to edge portion 20be of semiconductor light-emitting element 20b is larger than the area of opening portion 44as that is more distant from edge portion 20be than opening portion 44ab is. Accordingly, in this variation, the area of n exposure portion 30eb that is close to edge portion 20be of semiconductor light-emitting element 20b is larger than the area of n exposure portion 30es that is distant from edge portion 20be than n exposure portion 30eb is.

As has already been described in Variation 1 of this embodiment, heat could be less dissipated at the periphery of semiconductor light-emitting element 20b. However, in semiconductor light-emitting element 20b according to this variation, by increasing the area of opening portion 44ab that is close to edge portion 20be, it is possible to increase a heat dissipation path while dispersing the source of heat generation, and this in turn makes it possible to enhance heat dissipation at the periphery of semiconductor light-emitting element 20b.

Embodiment 2

A semiconductor light-emitting element and a semiconductor light-emitting device according to Embodiment 2 will be described. The semiconductor light-emitting element and the semiconductor light-emitting device according to this embodiment each have, in addition to at least one first n terminal region, at least one second n terminal region in which at least one second n connecting member is to be disposed. This is a difference from the semiconductor light-emitting element and the semiconductor light-emitting device according to Embodiment 1. The following mainly focuses on the difference between the semiconductor light-emitting element and the semiconductor light-emitting device according to this embodiment and the semiconductor light-emitting element and the semiconductor light-emitting device according to Embodiment 1.

[2-1. Overall Configuration]

Figure 16:
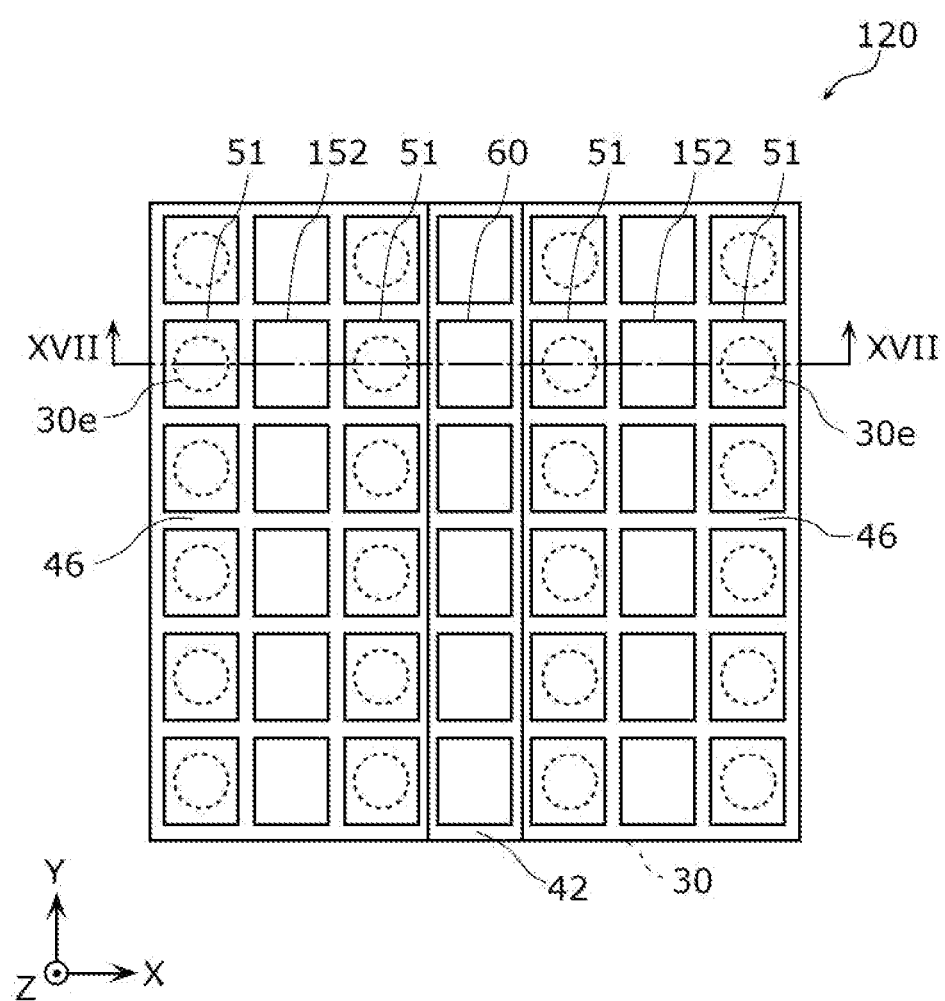
FIG. 16 is a schematic plan view illustrating an overall configuration of a semiconductor light-emitting element according to Embodiment 2.
Figure 17:
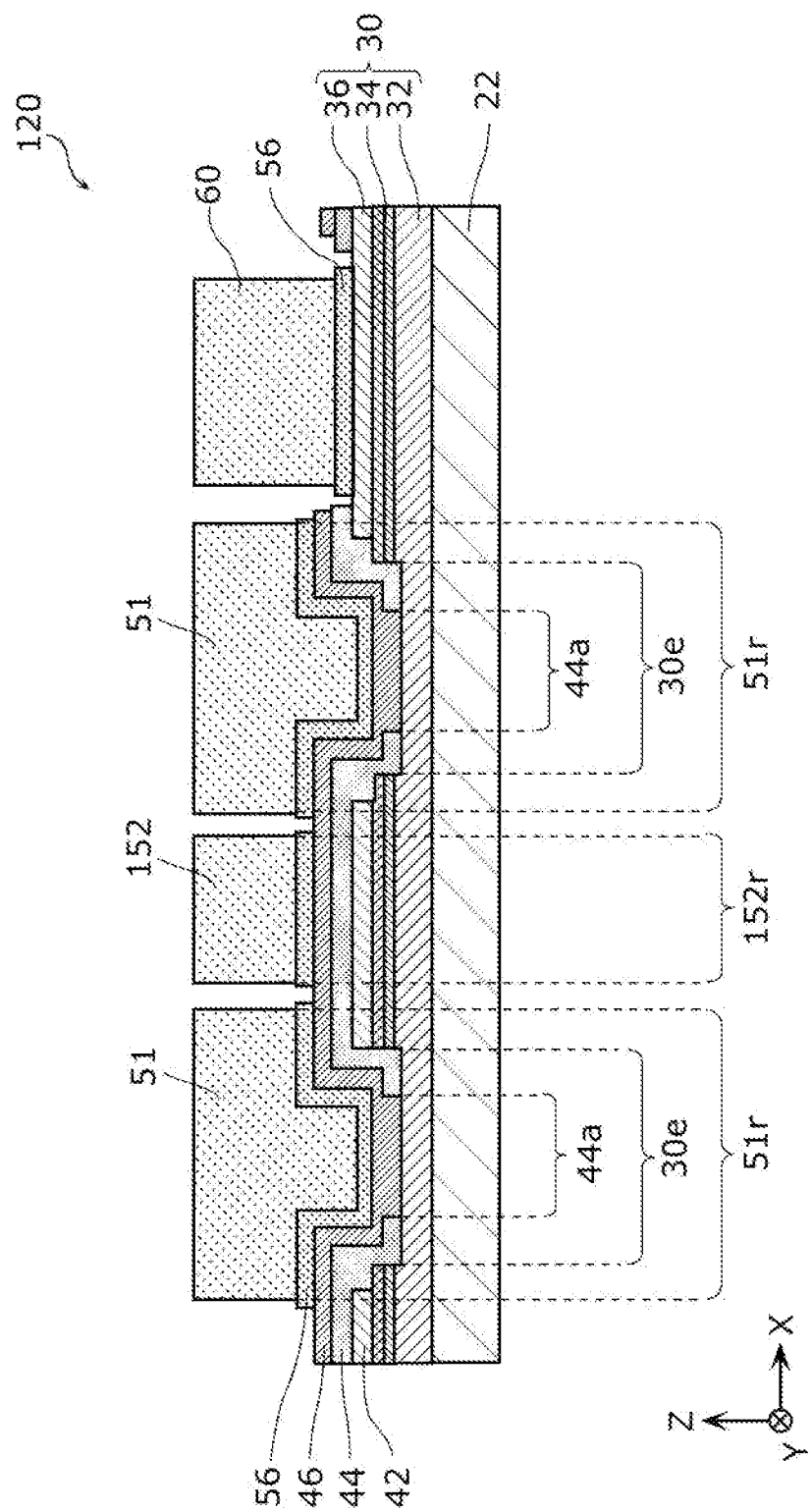
FIG. 17 is a cross-sectional view illustrating the overall configuration of the semiconductor light-emitting element according to Embodiment 2.

First, the following describes a configuration of the semiconductor light-emitting element according to this embodiment with reference to FIG. 16 and FIG. 17. FIG. 16 and FIG. 17 are a schematic plan view and a schematic cross-sectional view, respectively, illustrating an overall configuration of semiconductor light-emitting element 120 according to this embodiment. FIG. 16 illustrates a plan view of n wiring electrode layer 46 of semiconductor light-emitting element 120. FIG. 17 illustrates part of a cross-section of semiconductor light-emitting element 120 taken along the line XVII-XVII in FIG. 16.

Semiconductor light-emitting element 120 according to this embodiment includes growth substrate 22, semiconductor stack 30, p wiring electrode layer 42, insulating layer 44, and n wiring electrode layer 46. In this embodiment, semiconductor light-emitting element 120 further includes seed metal layers 56, at least one first n connecting member 51, at least one second n connecting member 152, and p connecting member 60.

At least one second n connecting member 152 is a conductive member for electric connection to an external conductor and is connected to n wiring electrode layer 46 in at least one second n terminal region 152r above n wiring electrode layer 46 disposed in a location other than n exposure portions 30e. Stated differently, at least one second n terminal region 152r, which is a region in which a conductive member for electric connection to an external conductor is to be disposed, is set above n wiring electrode layer 46 disposed in the location other than n exposure portions 30e. Note that in this embodiment, seed metal layer 56 is disposed also between second n connecting member 152 and n wiring electrode layer 46. The number of second n connecting members 152 may be, but not specifically limited to, at least one. For example, the number of second n connecting members 152 may be plural.

It should be noted that a semiconductor light-emitting device can be formed by mounting semiconductor light-emitting element 120 according to this embodiment to mounting board 11 according to Embodiment 1, although the formation process is not shown in the drawings.

[2-2. Operations and Advantageous Effects]

Next, the operations and advantageous effects of semiconductor light-emitting element 120 according to this embodiment will be described.

As described above, at least one second n terminal region 152r, which is a region in which a conductive member for electric connection to an external conductor is to be disposed, is set above n wiring electrode layer 46 disposed in a location other than n exposure portions 30e of semiconductor light-emitting element 120 according to this embodiment. Note that the number of second n terminal regions 152r may be, but not specifically limited to, at least one. For example, the number of n exposure portions 30e may be plural.

By thus setting at least one second n terminal region 152r, it is possible to form additional heat dissipation paths besides the heat dissipation paths of semiconductor light-emitting element 20 according to Embodiment 1 when a conductive member like second n connecting member 152 is disposed in at least one second n terminal region 152r. It is therefore possible to further enhance the heat dissipation of semiconductor light-emitting element 120, compared to semiconductor light-emitting element 20 according to Embodiment 1.

Figure 18:
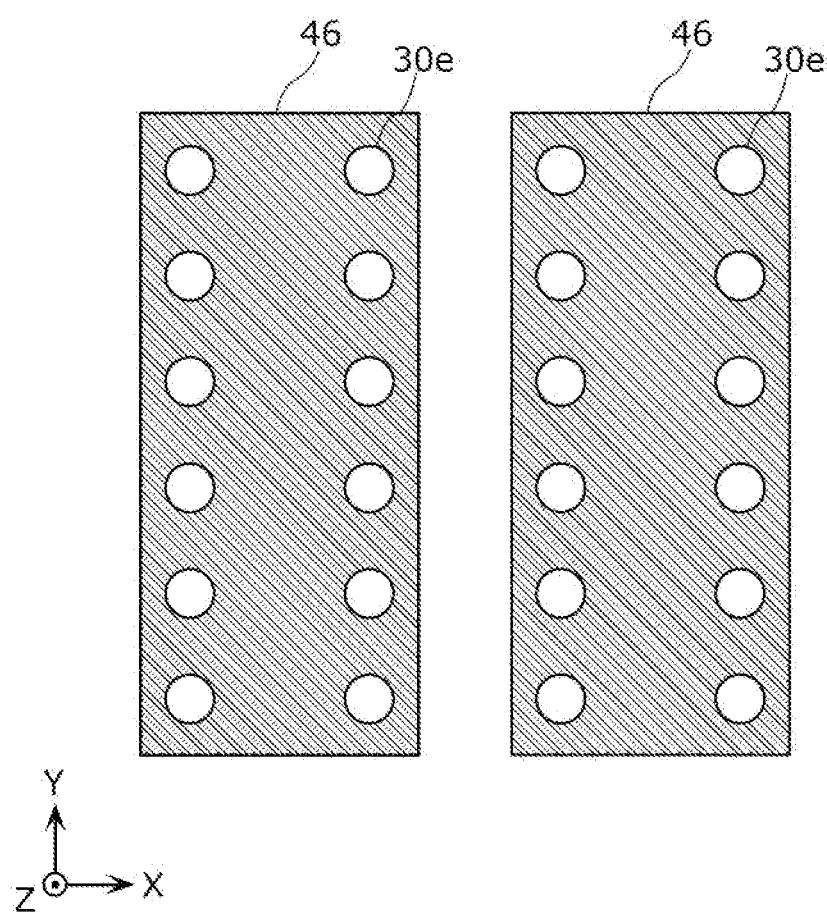
FIG. 18 is a plan view illustrating n wiring electrode layers each disposed at a location other than n exposure portions according to Embodiment 2.
Figure 19:
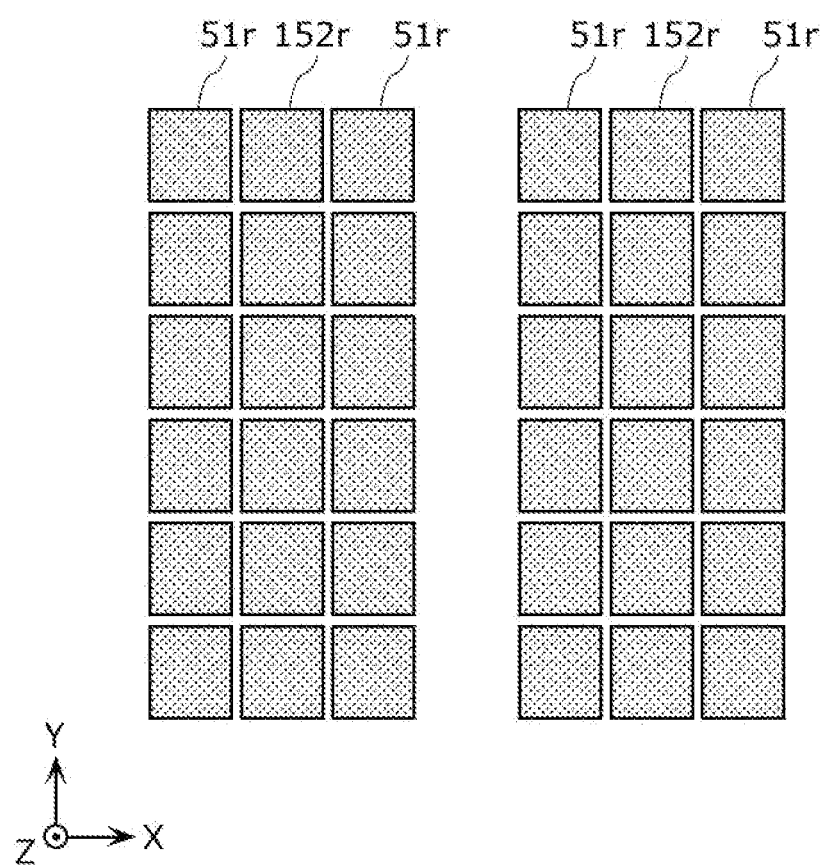
FIG. 19 is a plan view illustrating first n terminal regions and second n terminal regions according to Embodiment 2.

Next, the configurations of at least one first n terminal region 51r and at least one second n terminal region 152r will be described in detail with reference to FIG. 18 and FIG. 19. FIG. 18 is a plan view illustrating n wiring electrode layer 46 disposed in a location other than n exposure portions 30e according to this embodiment. FIG. 19 is a plan view illustrating at least one first n terminal region 51r and at least one second n terminal region 152r according to this embodiment.

In this embodiment, in the plan view of n wiring electrode layer 46, a total sum of the areas of at least one first n terminal region 51r and at least one second n terminal region 152r, as illustrated in FIG. 19, is larger than a total area of n wiring electrode layer 46 disposed in the location other than n exposure portions 30e, as illustrated in FIG. 18.

By thus increasing the areas of first n terminal region 51r and second n terminal region 152r, it is possible to increase the number of heat dissipation paths when conductive members are disposed in at least one first n terminal region 51r and at least one second n terminal region 152r. It is therefore possible to enhance the heat dissipation of semiconductor light-emitting element 120.

Moreover, in this embodiment, at least one first n connecting member 51 is distant from at least one second n connecting member 152, as illustrated in FIG. 16 and FIG. 17. With such a distance between first n connecting member 51 and second n connecting member 152, it is possible to disperse a mounting load during mounting and thus inhibit cracks in insulating layer 44.

[2-3. Simulation Results]

Figure 20A:
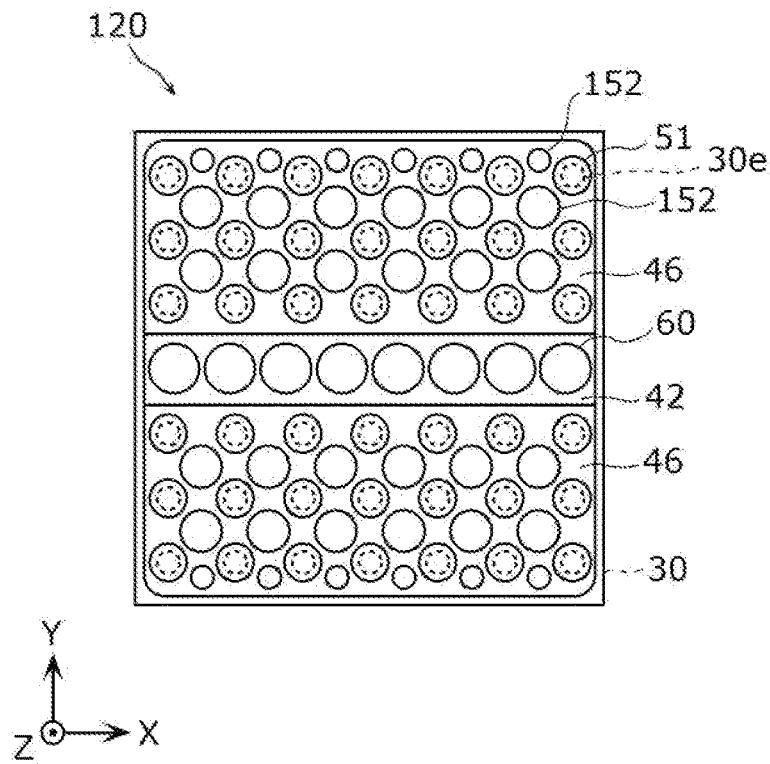
FIG. 20A is a schematic plan view illustrating a configuration of the semiconductor light-emitting element according to Embodiment 2 which is used for simulations.
Figure 20B:
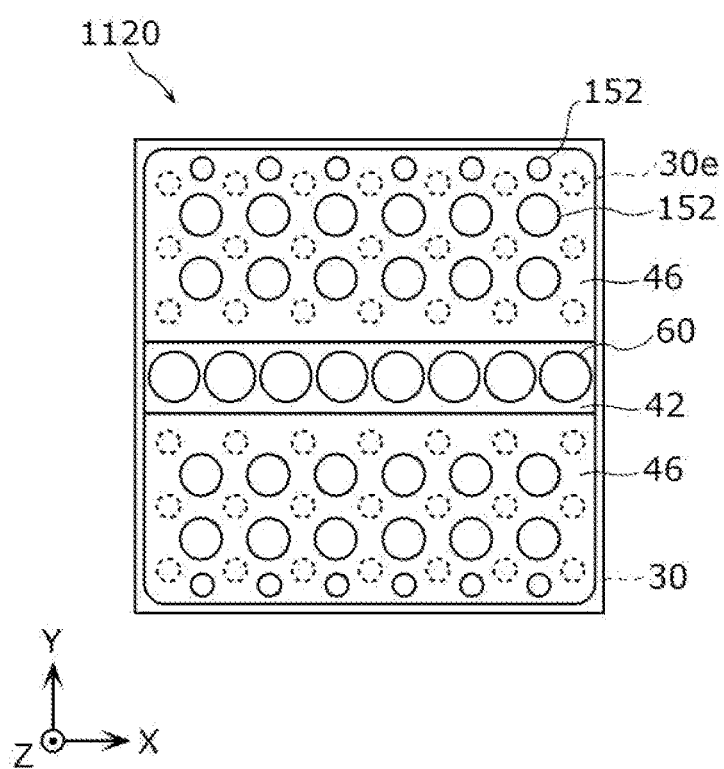
FIG. 20B is a schematic plan view illustrating a configuration of a semiconductor light-emitting element according to a comparative example, which is used for the simulations.

Next, the heat dissipation of semiconductor light-emitting element 120 according to this embodiment will be described using the results of simulations. FIG. 20A and FIG. 20B are schematic plan views illustrating the configurations of the semiconductor light-emitting element according to this embodiment and a semiconductor light-emitting element according to a comparative example, respectively, used in the simulations. As illustrated in FIG. 20A, semiconductor light-emitting element 120 used in the simulations includes forty-two first n connecting members 51, thirty-six second n connecting members 152, and eight p connecting members 60. In order to explain the advantageous effects attained by semiconductor light-emitting element 120 according to this embodiment, the simulations were conducted also for the semiconductor light-emitting element according to the comparative example. Semiconductor light-emitting element 1120 according to the comparative example does not include first n connecting member 51, as illustrated in FIG. 20B. Semiconductor light-emitting element 1120 is different from semiconductor light-emitting element 120 according to this embodiment regarding this point, but is the same as semiconductor light-emitting element 120 regarding other points.

Figure 21:
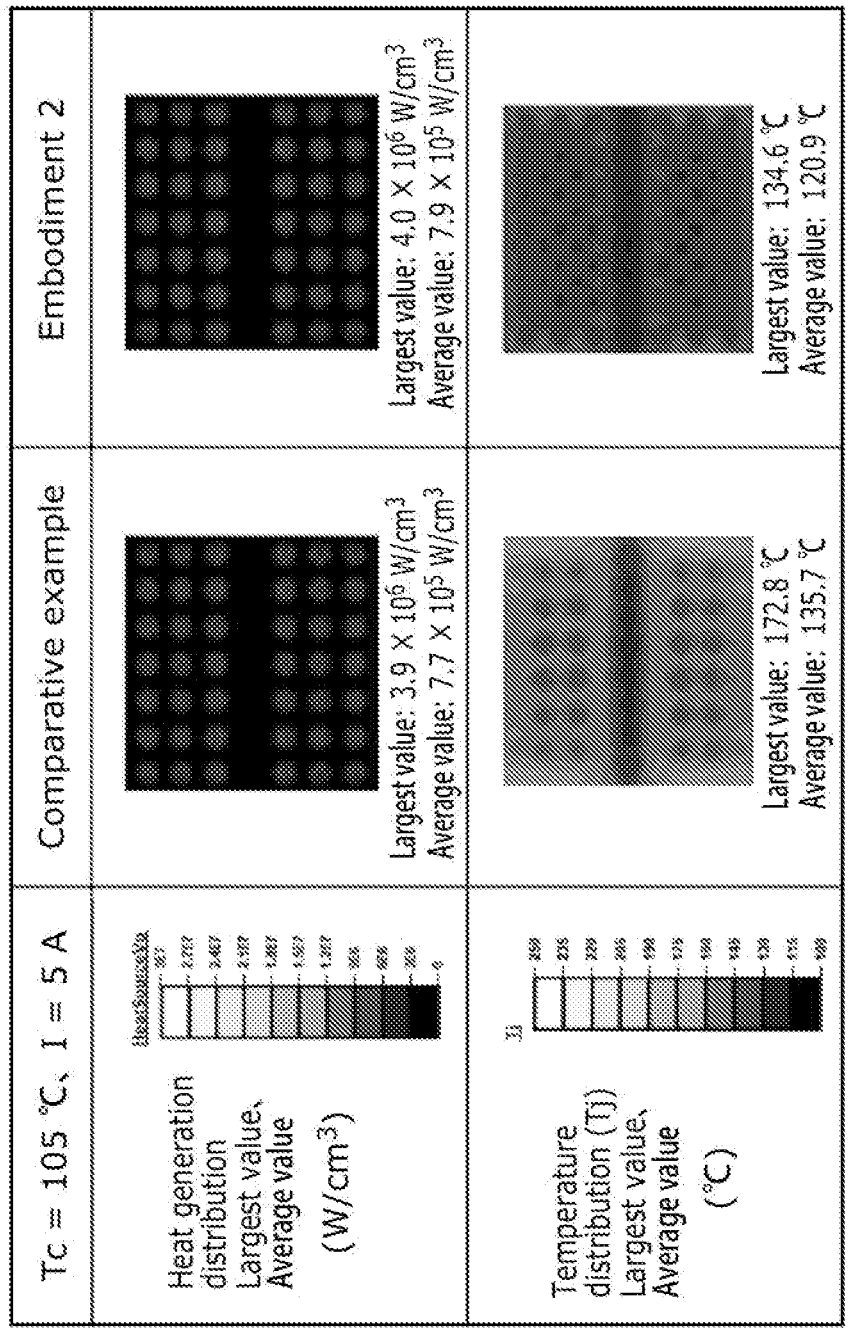
FIG. 21 is a diagram indicating the results of simulating a distribution of heat generation and a distribution of temperature Tj in each of the semiconductor light-emitting elements according to Embodiment 2 and the comparative example.
Figure 22:
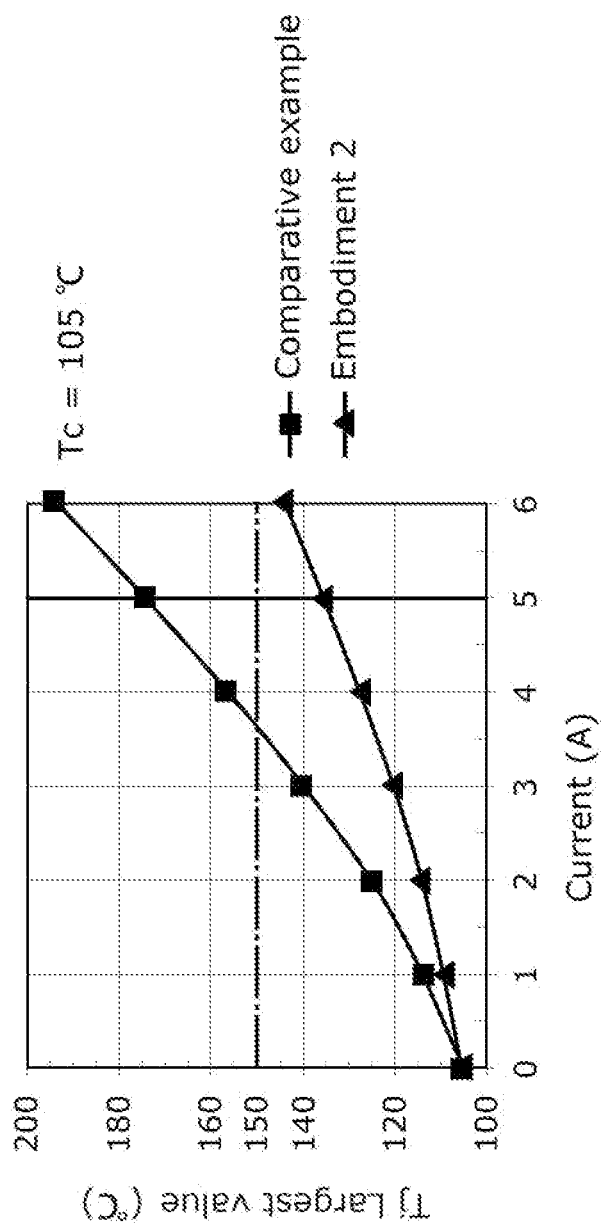
FIG. 22 is a graph indicating the results of simulating a relationship between the largest value of temperature Tj and the amount of current in each of the semiconductor light-emitting elements according to Embodiment 2 and the comparative example.

The results of the simulations conducted for each of semiconductor light-emitting elements 120 and 1120, the former illustrated in FIG. 20A and the latter in FIG. 20B, will be described with reference to FIG. 21 and FIG. 22. FIG. 21 is a diagram indicating the results of simulating a distribution of heat generation and a distribution of temperature in each of semiconductor light-emitting elements 120 and 1120. FIG. 21 indicates the largest values of the amount of generated heat as well as the largest values and average values of temperature. FIG. 22 is a graph indicating the results of simulating a relationship between the largest value of temperature Tj in light-emitting layer 34 and the amount of current in each of semiconductor light-emitting elements 120 and 1120.

In the simulations, the light emission output, voltage, and temperature distribution of GaN-based LED were calculated using software capable of calculating one-dimensional band structure as well as three-dimensional current distribution and temperature distribution. Each of semiconductor light-emitting elements 120 and 1120 includes growth substrate 22 comprising sapphire having the thickness of 100 μm and thermal conductivity of 50 W/m/K, and semiconductor stack 30 comprising GaN having the thickness of 12 μm and thermal conductivity of 120 W/m/K, as well as at least one first n connecting member 51, at least one second n connecting member 152, and p connecting member 60, all of which are Au having the thickness of 15 μm and thermal conductivity of 300 W/m/K. Moreover, board 12 of mounting board 11 on which each of semiconductor light-emitting elements 120 and 1120 is to be mounted is comprising an AlN sintered body having the thickness of 300 μm and thermal conductivity of 170 W/m/K. Furthermore, the simulations were conducted under the condition that a heat dissipation board comprising Cu having the thickness of 2 mm, temperature Tc of 105 degrees Celsius, and thermal conductivity of 400 W/m/K, is disposed in contact with an entire principal surface, of mounting board 11, of the side where each of semiconductor light-emitting elements 120 and 1120 is not to be mounted. Moreover, a voltage is applied to light-emitting layer 34 of semiconductor stack 30 of each of semiconductor light-emitting elements 120 and 1120, and temperature Tj of light-emitting layer 34 when currents from 1 A to 6 A are each supplied was obtained.

As illustrated in the upper stage in FIG. 21, heat generation concentrates in n exposure portions 30e in either case of using semiconductor light-emitting element 120 according to this embodiment or semiconductor light-emitting element 1120 according to the comparative example. An average value of the amount of generated heat per unit time was $7.7 \times 10^5$ W/cm$^3$ in semiconductor light-emitting element 1120 according to the comparative example and $7.9 \times 10^5$ W/cm$^3$ in semiconductor light-emitting element 120 according to this embodiment, which were similar. The largest values of the amounts of generated heat per unit time were also similar between the two: $3.9 \times 10^6$ W/cm$^3$ in semiconductor light-emitting element 1120 according to the comparative example; and $4.0 \times 10^6$ W/cm$^3$ in semiconductor light-emitting element 120 according to this embodiment.

Nevertheless, temperature is more suppressed in semiconductor light-emitting element 120 according to this embodiment than in semiconductor light-emitting element 1120 according to the comparative example.

Specifically, temperature Tj of light emitting layer 34 is high in the range from 150 to 165 degrees Celsius in the vicinity of n exposure portions 30e and exceeds 170 degrees Celsius at the periphery of semiconductor light-emitting element 1120 according to the comparative example, as illustrated in the lower stage in FIG. 21.

In contrast, temperature Tj is 115 degrees Celsius in the vicinity of n exposure portions 30e and is suppressed to at most 135 degrees Celsius at the periphery of semiconductor light-emitting element 120 according to this embodiment. The reason why temperature is thus suppressed in semiconductor light-emitting element 120 according to this embodiment is because heat is effectively dissipated from n exposure portions 30e to mounting board 11 and the heat dissipation plate via at least one first n connecting member 51 disposed in at least one n exposure portion 30e where the amount of generated heat is large.

Moreover, semiconductor light-emitting element 120 according to this embodiment, as compared to semiconductor light-emitting element 1120 according to the comparative example, can inhibit an increase in temperature Tj in light-emitting layer 34 each time when current is supplied. It is known that if the temperature of a light-emitting layer in a semiconductor light-emitting element exceeds 150 degrees Celsius, reliability is greatly impaired. In semiconductor light-emitting element 1120 according to the comparative example, when the amount of current supplied is at least approximately 4 A, temperature Tj of light-emitting layer 34 exceeds 150 degrees Celsius and reliability may be therefore impaired. In contrast, in semiconductor light-emitting element 120 according to this embodiment, temperature Tj of light-emitting layer 34 is inhibited to at most 150 degrees Celsius when current of any magnitude from 0 A to 6 A is supplied. In this way, with semiconductor light-emitting element 120 according to this embodiment provided with at least one first n connecting member 51, it is possible to reduce an increase in the temperature of light-emitting layer 34.

[2-4. Manufacturing Method]

Figure 23A:
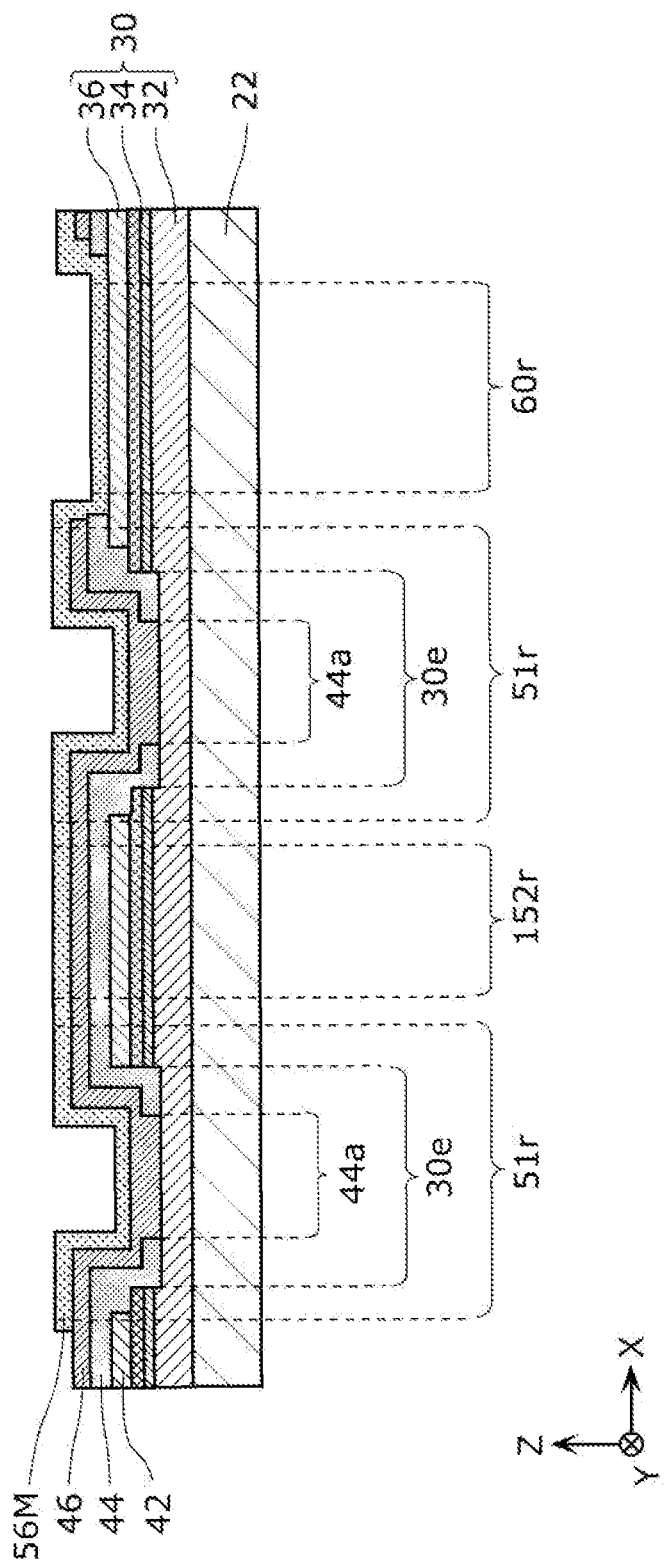
FIG. 23A is a schematic cross-sectional view illustrating a first process in a manufacturing method of the semiconductor light-emitting element according to Embodiment 2.
Figure 23B:
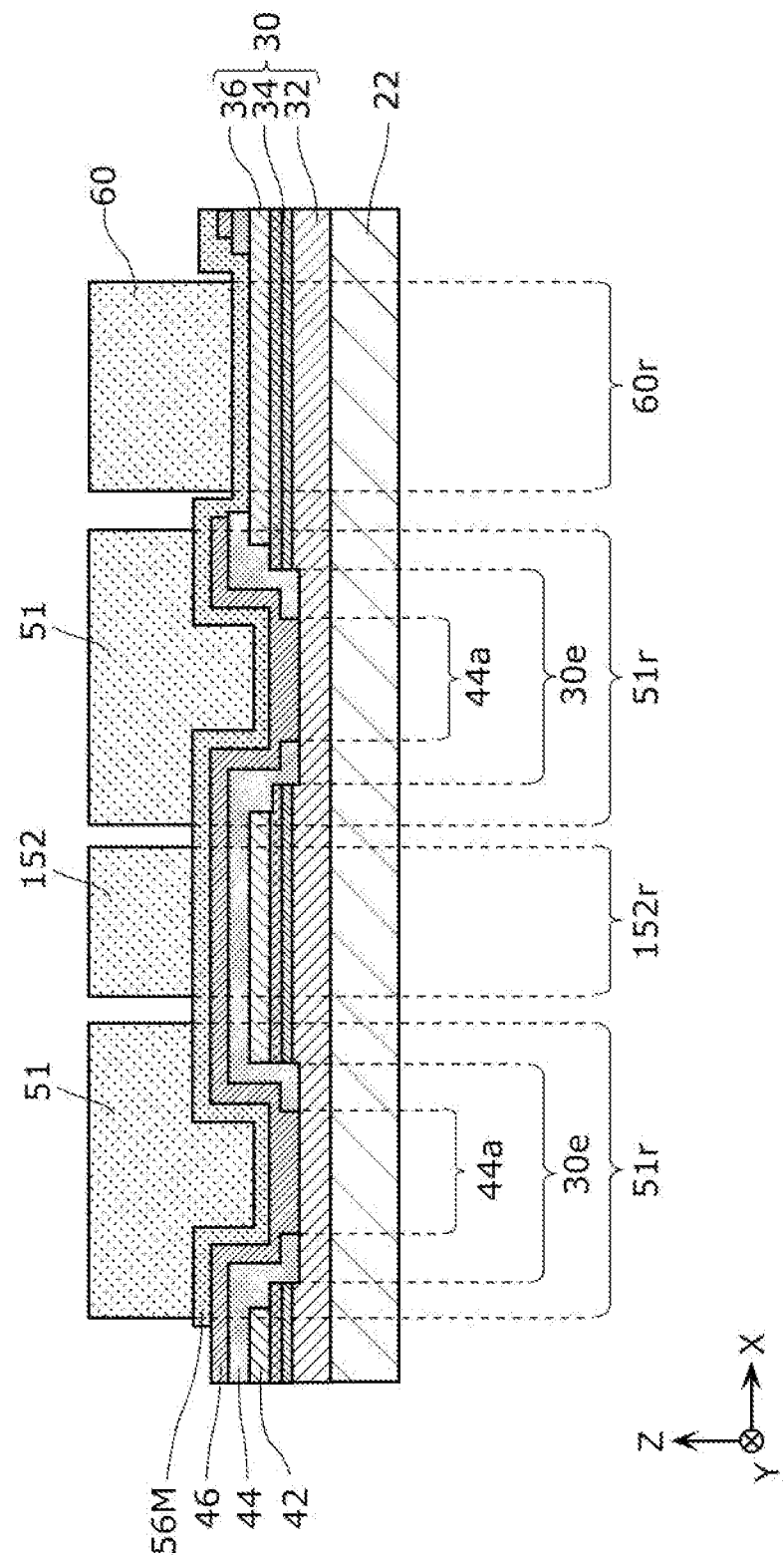
FIG. 23B is a schematic cross-sectional view illustrating a second process in the manufacturing method of the semiconductor light-emitting element according to Embodiment 2.
Figure 23C:
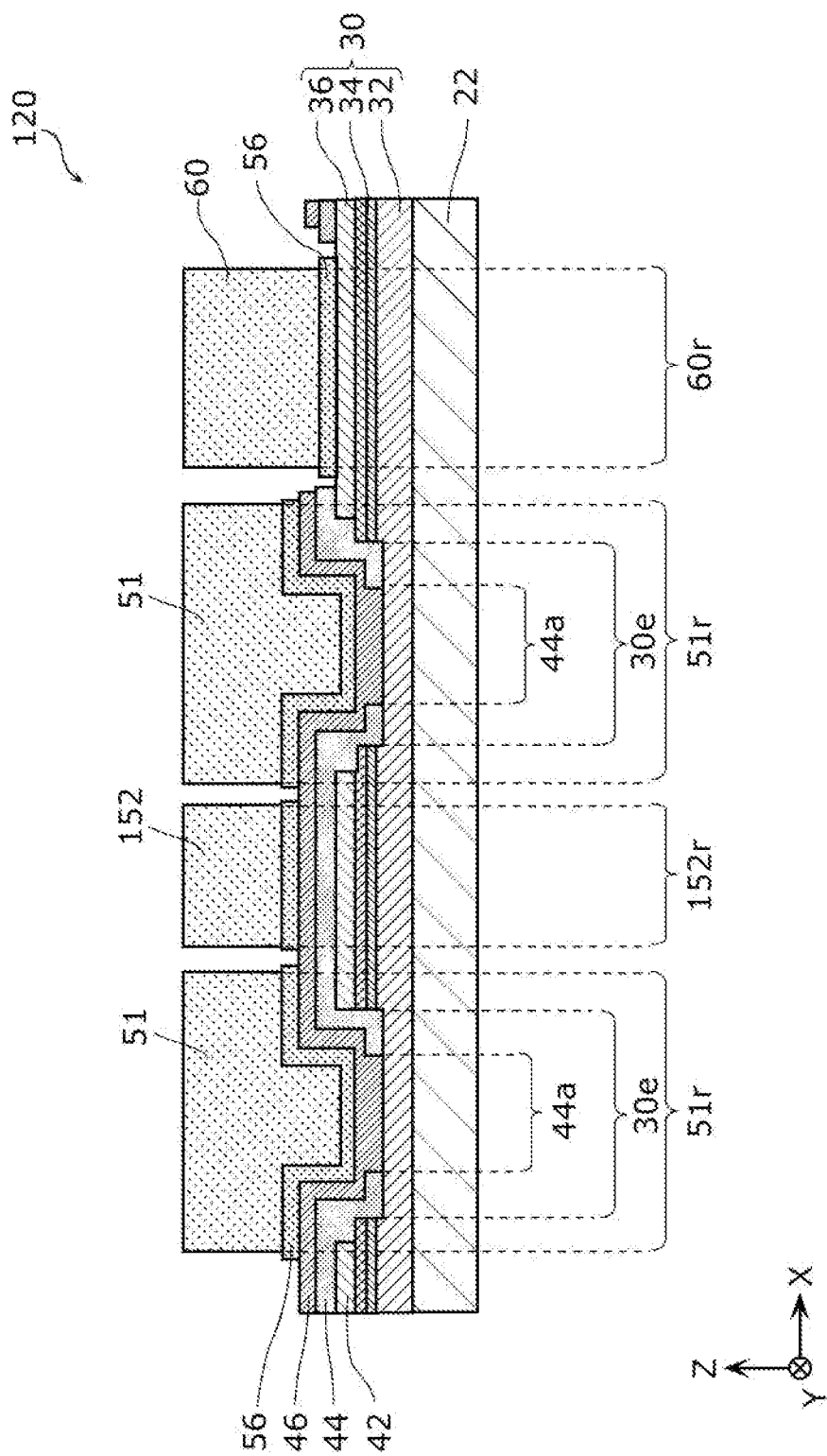
FIG. 23C is a schematic cross-sectional view illustrating a third process in the manufacturing method of the semiconductor light-emitting element according to Embodiment 2.

Next, a method of manufacturing semiconductor light-emitting element 120 according to this embodiment will be described with reference to FIG. 23A through FIG. 23C. FIG. 23A through FIG. 23C are each a schematic cross-sectional view illustrating a process in the manufacturing method of semiconductor light-emitting element 120 according to this embodiment.

First, as in the manufacturing method of semiconductor light-emitting element 20 according to Embodiment 1, semiconductor stack 30, p wiring electrode layer 42, insulating layer 44, n wiring electrode layer 46, and seed metal film 56M are sequentially formed on growth substrate 22, as illustrated in FIG. 23A. At least one first n terminal region 51r and at least one second n terminal region 152r, which are regions in which conductive members for electric connection to an external conductor are to be disposed, are set above n wiring electrode layer 46. Moreover, p terminal region 60r, which is a region in which a conductive member for electric connection to an external conductor is to be disposed, is set above p wiring electrode layer 42.

Subsequently, at least one first n connecting member 51 is formed in at least one first n terminal region 51r, and at least one second n connecting member 152 is formed in at least one second n terminal region 152r, as illustrated in FIG. 23B. In addition, p connecting member 60 is formed in p terminal region 60r. In this embodiment, a resist pattern which opens at least one n terminal region 51r, at least one second n terminal region 152r, and p terminal region 60r is formed using the photolithography technique. After the formation of Au plating at the opening portions of the resist pattern through DC electroplating, resist is removed.

Subsequently, seed metal layer 56 is formed by removing the regions of seed metal film 56M on which at least one first n connecting member 51, second n connecting member 152, and p connecting member 60 are not disposed, as illustrated in FIG. 23C. In this embodiment, seed metal film 56M is removed by selectively etching an Au film and a Ti film which form seed metal film 56M. In this way, seed metal layer 56 is formed.

Semiconductor light-emitting device 120 according to this embodiment is manufactured as described above. It should be noted that a semiconductor light-emitting device according to this embodiment can be manufactured by mounting semiconductor light-emitting element 120 on mounting board 11. In this embodiment, in addition to at least one first n connecting member 51, at least one second n connecting member 152 is also bonded to first wiring electrode 15 of mounting board 11.

Embodiment 3

A semiconductor light-emitting element and a semiconductor light-emitting device according to Embodiment 3 will be described. According to this embodiment, at least one first n connecting member and p connecting member are disposed on a mounting board and then bonded to the semiconductor light-emitting element, which is a main difference from the semiconductor light-emitting device according to Embodiment 1. The following mainly focuses on the difference between the semiconductor light-emitting element and the semiconductor light-emitting device according to this embodiment and the semiconductor light-emitting element and the semiconductor light-emitting device according to Embodiment 1.

[3-1. Overall Configuration]

Figure 24:
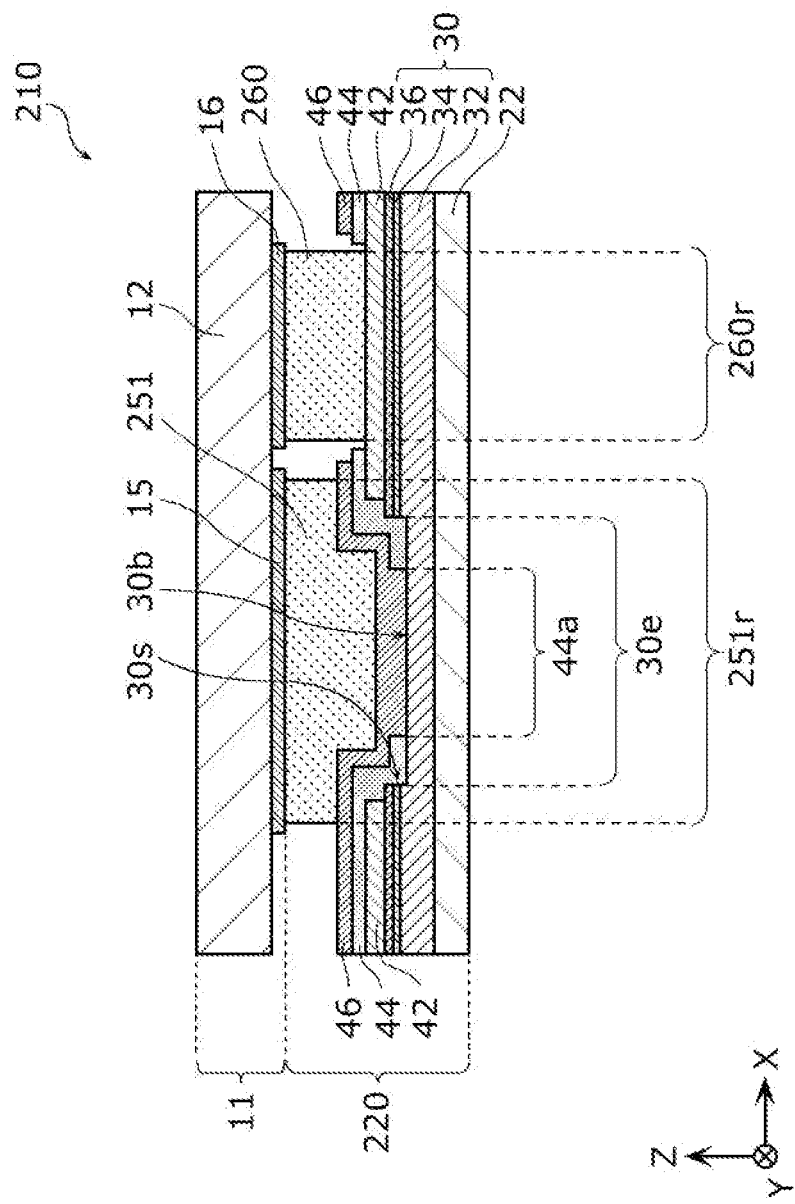
FIG. 24 is a schematic cross-sectional view illustrating an overall configuration of a semiconductor light-emitting device according to Embodiment 3.

First, the following describes configurations of the semiconductor light-emitting element and the semiconductor light-emitting device according to this embodiment with reference to FIG. 24. FIG. 24 is a schematic cross-sectional view illustrating an overall configuration of semiconductor light-emitting device 210 according to this embodiment. FIG. 24 illustrates a cross-section of semiconductor light-emitting device 210 which is the same as that illustrated in FIG. 2A.

As illustrated in FIG. 24, semiconductor light-emitting device 210 according to this embodiment includes mounting board 11 and semiconductor light-emitting element 220.

Semiconductor light-emitting element 220 includes growth substrate 22, semiconductor stack 30, p wiring electrode layer 42, insulating layer 44, and n wiring electrode layer 46. In this embodiment, semiconductor light-emitting element 220 further includes at least one first n connecting member 251 and p connecting member 260. Semiconductor light-emitting element 220 does not include seed metal layer 56 since at least one first n connecting member 251 and p connecting member 260 are formed on mounting board 11 and then bonded to semiconductor light-emitting element 220.

At least one first n connecting member 251 is a conductive member for electric connection to an external conductor and is connected to n wiring electrode layer 46 in at least one first n terminal region 251r. Stated differently, at least one first n terminal region 251r, which is a region in which a conductive member for electric connection to an external conductor is to be disposed, is set for n wiring electrode layer 46. Note that the numbers of first n connecting members 251 and first n terminal regions 251r may be, but not specifically limited to, at least one. For example, the numbers of first n connecting members 251 and first n terminal regions 251r may be plural.

P connecting member 260 is a conductive member for electric connection to an external conductor, and is connected to p wiring electrode layer 42 in p terminal region 260r. Stated differently, p terminal region 260r, which is a region in which a conductive member for electrical connection with an external conductor is to be disposed, is set for p wiring electrode layer 42. The numbers of p connecting members 260 and p terminal regions 260r may be, but not specifically limited to, at least one. For example, the numbers of p connecting members 260 and p terminal regions 260r may be plural.

Even with semiconductor light-emitting device 210 according to this embodiment, the same advantageous effects as those attained by semiconductor light-emitting device 10 according to Embodiment 1 are produced.

[3-2. Manufacturing Method]

Figure 25A:
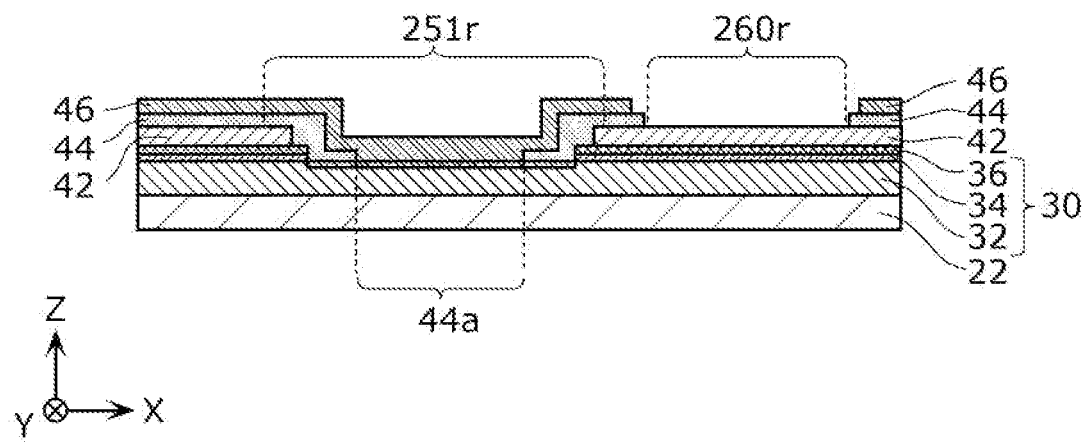
FIG. 25A is a schematic cross-sectional view illustrating a first process in a manufacturing method of the semiconductor light-emitting device according to Embodiment 3.
Figure 25B:
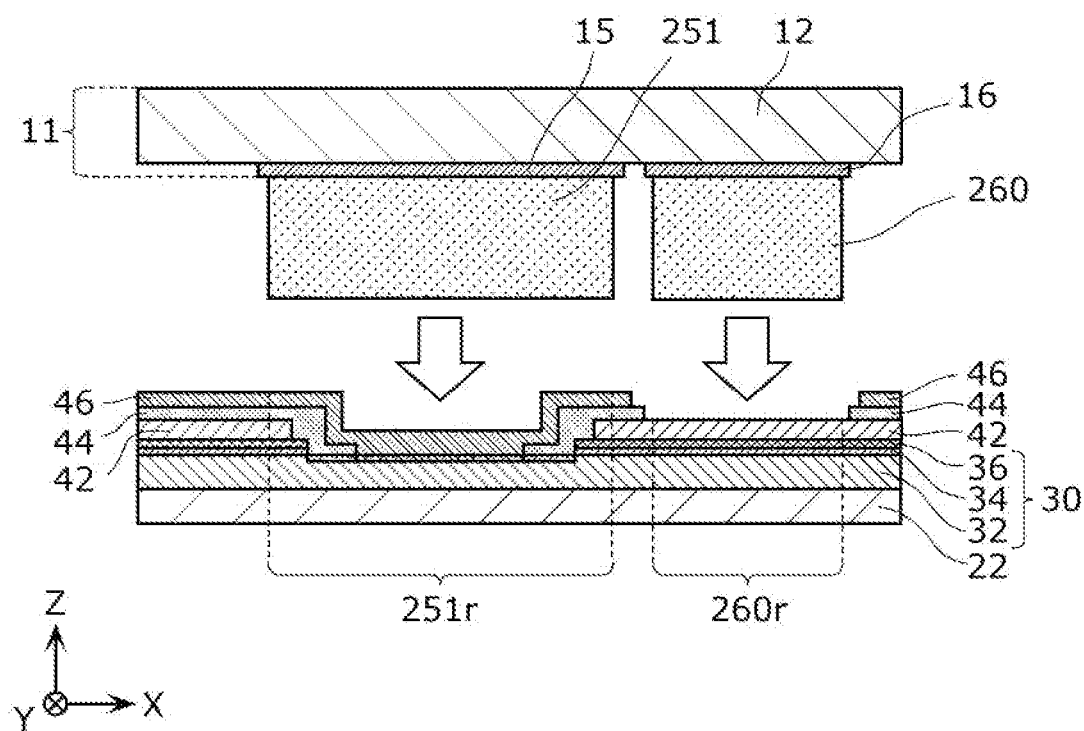
FIG. 25B is a schematic cross-sectional view illustrating a second process in the manufacturing method of the semiconductor light-emitting device according to Embodiment 3.

Next, a method of manufacturing semiconductor light-emitting device 210 according to this embodiment will be described with reference to FIG. 25A through FIG. 25C. FIG. 25A through FIG. 25C are each a schematic cross-sectional view illustrating a process in the manufacturing method of semiconductor light-emitting device 210 according to this embodiment.

As is the same as in the manufacturing method of semiconductor light-emitting device 10 according to Embodiment 1, first, semiconductor stack 30, p wiring electrode layer 42, insulating layer 44, and n wiring electrode layer 46 are sequentially formed on growth substrate 22, as illustrated in FIG. 25A. At least one first n terminal region 251r, which is a region in which a conductive member for electric connection to an external conductor is to be disposed, is set above n wiring electrode layer 46. In addition, p terminal region 260r, which is a region in which a conductive member for electric connection to an external conductor is to be disposed, is set above p wiring electrode layer 42.

Subsequently, mounting board 11 is prepared, as illustrated in FIG. 25B. In this embodiment, at least one first n connecting member 251 and p connecting member 260 are formed on first wiring electrode 15 and second wiring electrode 16 of mounting board 11, respectively.

Subsequently, at least one first n connecting member 251 and p connecting member 260 formed on mounting board 11 are bonded to at least one first n terminal region 251r above n wiring electrode layer 46 and p terminal region 260r above p wiring electrode layer 42, respectively, as illustrated in FIG. 25C.

Semiconductor light-emitting element 220 and semiconductor light-emitting device 210 according to this embodiment are manufactured as described above.

[3-3. Variations]

Figure 26A:
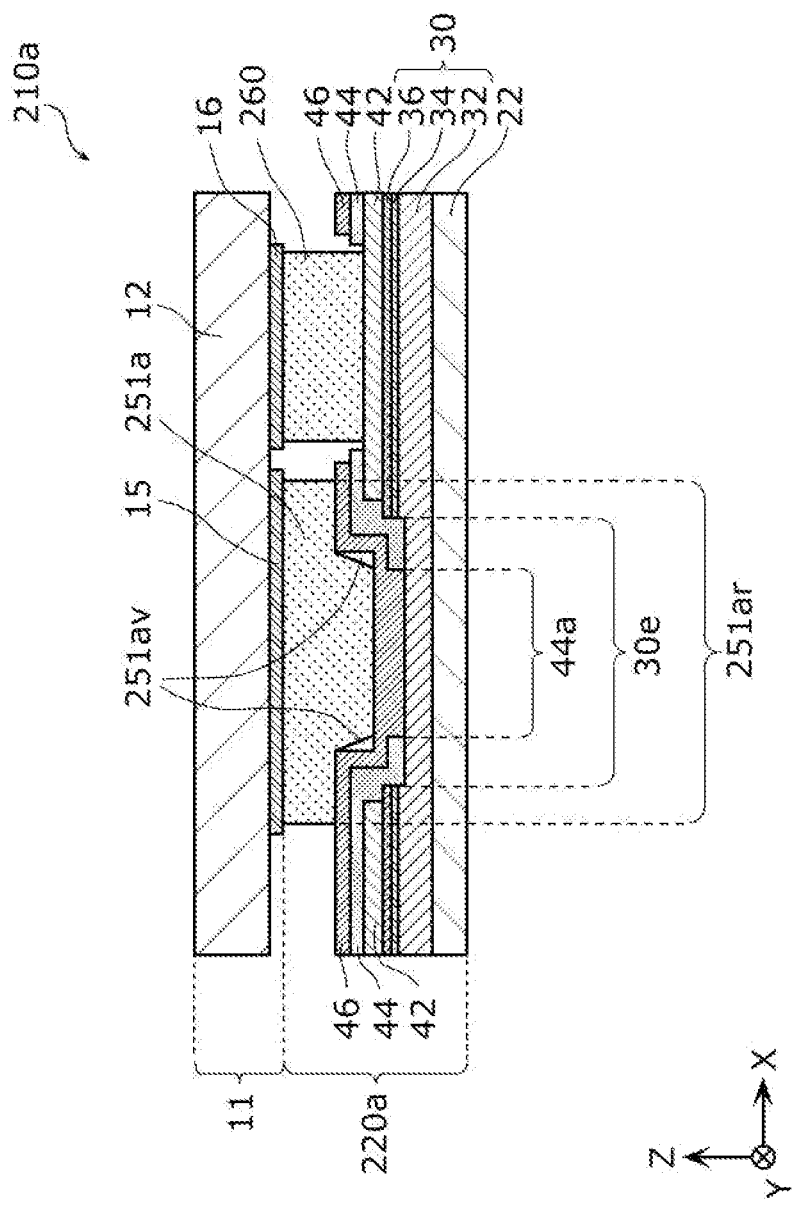
FIG. 26A is a schematic cross-sectional view illustrating an overall configuration of a semiconductor light-emitting device according to a variation of Embodiment 3.

Next, variations of the semiconductor light-emitting element and the semiconductor light-emitting device according to this embodiment will be described with reference to FIG. 26A and FIG. 26B. FIG. 26A is a schematic cross-sectional view illustrating an overall configuration of semiconductor light-emitting device 210a according to one variation of this embodiment.

As illustrated in FIG. 26A, semiconductor light-emitting device 210a according to the variation includes mounting board 11 and semiconductor light-emitting element 220a.

Semiconductor light-emitting element 220a includes growth substrate 22, semiconductor stack 30, p wiring electrode layer 42, insulating layer 44, and n wiring electrode layer 46. In this variation, semiconductor light-emitting element 220a further includes at least one first n connecting member 251a and p connecting member 260.

At least one first n connecting member 251a is a conductive member for electric connection to an external conductor, and is connected to n wiring electrode layer 46 in at least one first n terminal region 251ar. Stated differently, at least one first n terminal region 251ar, which is a region in which a conductive member for electric connection to an external conductor is to be disposed, is set for n wiring electrode layer 46. Note that the numbers of first n connecting members 251a and first n terminal regions 251ar may be, but not specifically limited to, at least one. For example, the numbers of first n connecting members 251a and first n terminal regions 251ar may be plural.

As illustrated in FIG. 26A, void portions 251av are formed between at least one first n connecting member 251a and n wiring electrode layer 46 according to the variation. Such void portions 251av can be formed when first n connecting member 251a is bonded to n wiring electrode layer 46 after first n connecting member 251a is formed on mounting board 11. Void portions 251av are formed by, for example, setting a mounting load for bonding first n connecting member 251a to n wiring electrode layer 46 to be less than a mounting load for bonding, to n wiring electrode layer 46, first n connecting member 251 of semiconductor light-emitting device 210 according to Embodiment 3.

As described above, there may be a region in which at least one first n connecting member 251a is not connected to n wiring electrode layer 46 in at least one first n terminal region 251ar of semiconductor light-emitting element 220a.

The shape of a void formed between at least one first n connecting member 251a and n wiring electrode layer 46 according to this variation is not limited to the example illustrated in FIG. 26A. The void may be formed, for example, in the entire region above opening portion 44a. An example of such void will be described with reference to FIG. 26B. FIG. 26B is a schematic cross-sectional view illustrating an overall configuration of semiconductor light-emitting device 210b according to another variation of this embodiment.

As illustrated in FIG. 26B, semiconductor light-emitting element 220b included in semiconductor light-emitting device 210b includes at least one first n connecting member 251b. At least one first n connecting member 251b is connected to n wiring electrode layer 46 in at least one first n terminal region 251br.

In semiconductor light-emitting element 220b, void portion 251bv is formed between at least one first n connecting member 251b and n wiring electrode layer 46. Semiconductor light-emitting device 210b has at least one first n connecting member 251b and void portion 251bv different from first n connecting member 251a and void portions 251av of semiconductor light-emitting device 210a, while the other elements are the same as those in semiconductor light-emitting device 210a. In semiconductor light-emitting device 210b, void portion 251bv is formed in the entire region above opening portion 44a. Such void portion 251bv can be formed when first n connecting member 251b is bonded to n wiring electrode layer 46 after first n connecting member 251b is formed on mounting board 11. Void portion 251bv is formed in the entire region above opening portion 44a by, for example, setting a mounting load for bonding first n connecting member 251b to n wiring electrode layer 46 to be less than a mounting load for bonding, to n wiring electrode layer 46, first n connecting member 251 of semiconductor light-emitting device 210 according to Embodiment 3.

As described above, it is possible to dissipate heat generated in the vicinity of the inner lateral surfaces 30s of n exposure portion 30e via at least one first n connecting member 251b even though there is a region in which at least one first n connecting member 251b is not connected to n wiring electrode layer 46 in at least one first n terminal region 251br of semiconductor light-emitting element 220b. It is therefore possible to enhance the heat dissipation of semiconductor light-emitting element 220b.

Even with semiconductor light-emitting device 210a or 210b according to different one of the variations, the same advantageous effects as those attained by semiconductor light-emitting device 10 according to Embodiment 1 are produced.

Embodiment 4

A semiconductor light-emitting element and a semiconductor light-emitting device according to Embodiment 4 will be described. According to this embodiment, one portion of a first n connecting member is disposed on the semiconductor light-emitting element while the other portion of the first n connecting member is disposed on a mounting board, and then the portions are bonded to each other. Likewise, one portion of a p connecting member is disposed on the semiconductor light-emitting element while the other portion of the p connecting member is disposed on the mounting board, and then the portions are bonded to each other. This makes the semiconductor light-emitting device according to this embodiment different from the semiconductor light-emitting device according to Embodiment 1. The following mainly focuses on the difference between the semiconductor light-emitting element and the semiconductor light emitting device according to this embodiment and the semiconductor light-emitting element and the semiconductor light emitting device according to Embodiment 1.

[4-1. Overall Configuration]

Figure 27:
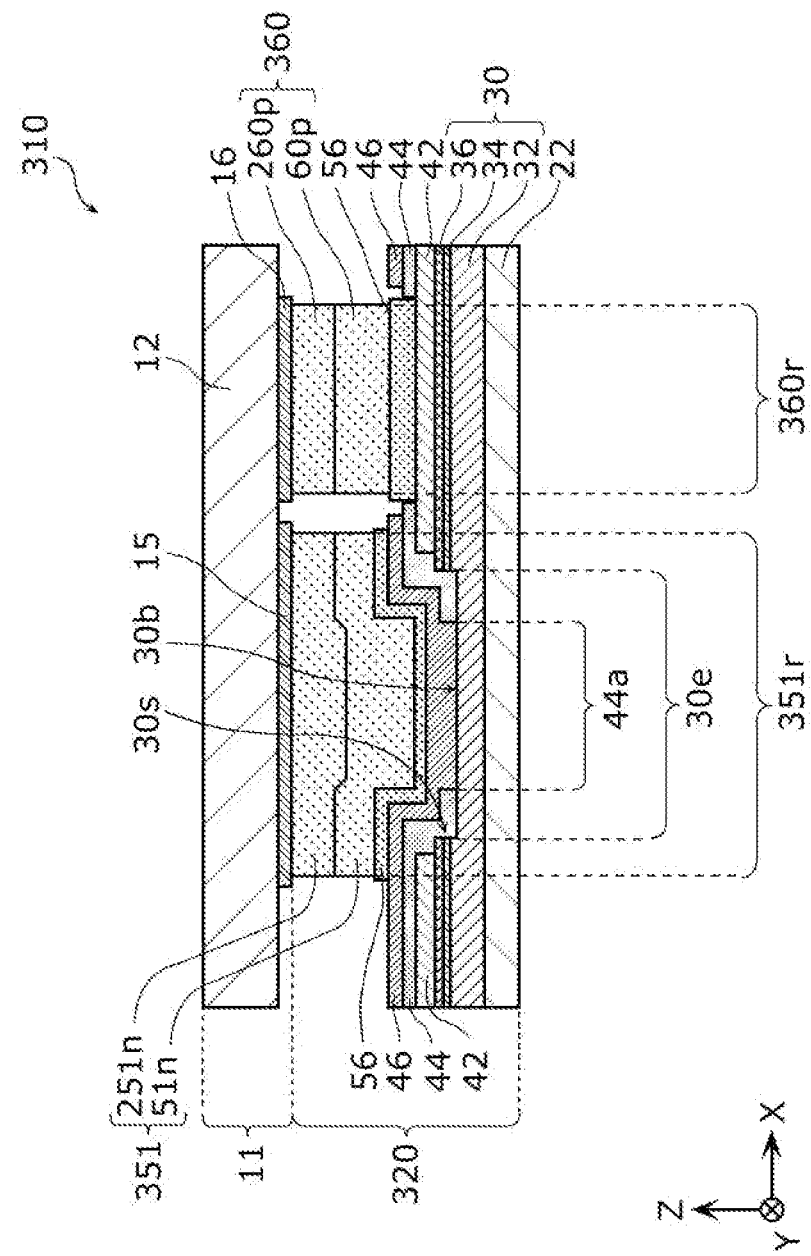
FIG. 27 is a schematic cross-sectional view illustrating an overall configuration of a semiconductor light-emitting device according to Embodiment 4.

First, configurations of the semiconductor light-emitting element and the semiconductor light emitting device according to this embodiment will be described with reference to FIG. 27. FIG. 27 is a schematic cross-sectional view illustrating an overall configuration of semiconductor light-emitting device 310 according to this embodiment. FIG. 27 illustrates the same cross section as that of semiconductor light-emitting device 10 illustrated in FIG. 2A.

As illustrated in FIG. 27, semiconductor light-emitting device 310 according to this embodiment includes mounting board 11 and semiconductor light-emitting element 320.

Semiconductor light-emitting element 320 includes growth substrate 22, semiconductor stack 30, p wiring electrode layer 42, insulating layer 44, and n wiring electrode layer 46. In this embodiment, semiconductor light-emitting element 320 further includes seed metal layer 56, at least one first n connecting member 351, and p connecting member 360.

At least one first n connecting member 351 is a conductive member for electric connection to an external conductor, and is connected to n wiring electrode layer 46 in at least one first n terminal region 351r. Stated differently, at least one first n terminal region 351r, which is a region in which a conductive member for electric connection to an external conductor is to be disposed, is set for n wiring electrode layer 46. Note that the numbers of first n connecting members 351 and first n terminal regions 351r may be, but not specifically limited to, at least one. For example, the numbers of first n connecting members 351 and first n terminal regions 351r may be plural.

In this embodiment, first n connecting member 351 includes a pair of element-side n connecting member 51n and mounting-board-side n connecting member 251n.

Element-side n connecting member 51n has the same configuration as that of first n connecting member 51 according to Embodiment 1. Mounting-board-side n connecting member 251n has the same configuration as that of first n connecting member 251 according to Embodiment 3. Element-side n connecting member 51n is disposed in a location closer to semiconductor stack 30 than mounting-board-side n connecting member 251n is.

P connecting member 360 is a conductive member for electric connection to an external conductor, and is connected to p wiring electrode layer 42 in p terminal region 360r. Stated differently, p terminal region 360r, which is a region in which a conductive member for electric connection to an external conductor is to be disposed, is set for p wiring electrode layer 42. The numbers of p connecting members 360 and p terminal regions 360r may be, but not specifically limited to, at least one. For example, the numbers of p connecting members 360 and p terminal regions 360r may be plural.

In this embodiment, p connecting member 360 includes a pair of element-side p connecting member 60p and mounting-board-side p connecting member 260p.

Element-side p connecting member 60p has the same configuration as that of p connecting member 60 according to Embodiment 1. Mounting-board-side p connecting member 260p has the same configuration as that of p connecting member 260 according to Embodiment 3. Element-side p connecting member 60p is disposed in a location closer to semiconductor stack 30 than mounting-board-side p connecting member 260p is.

Even with semiconductor light-emitting device 310 according to this embodiment, the same advantageous effects as those attained by semiconductor light-emitting device 10 according to Embodiment 1 are produced.

[4-2. Manufacturing Method]

Figure 28A:
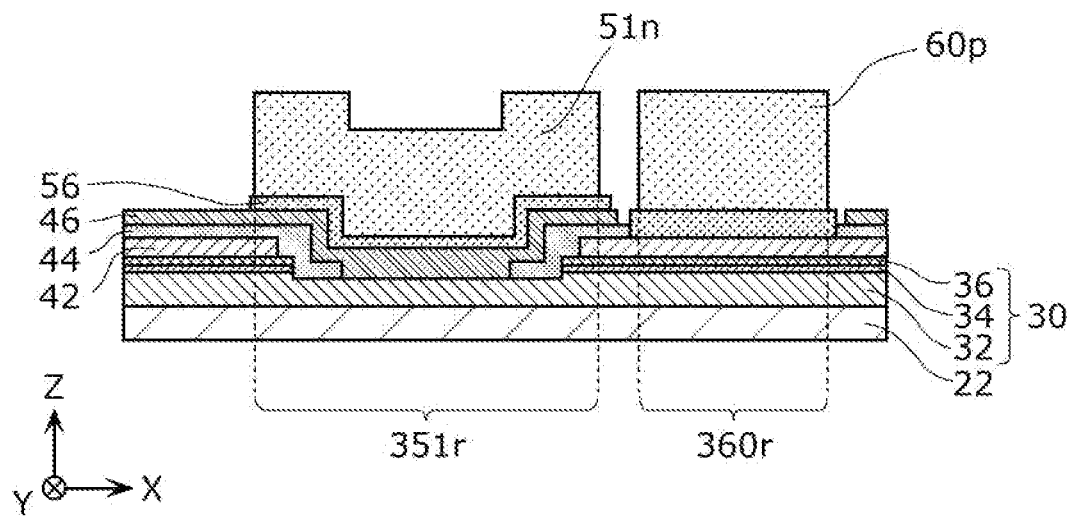
FIG. 28A is a schematic cross-sectional view illustrating a first process in a manufacturing method of the semiconductor light-emitting device according to Embodiment 4.
Figure 28B:
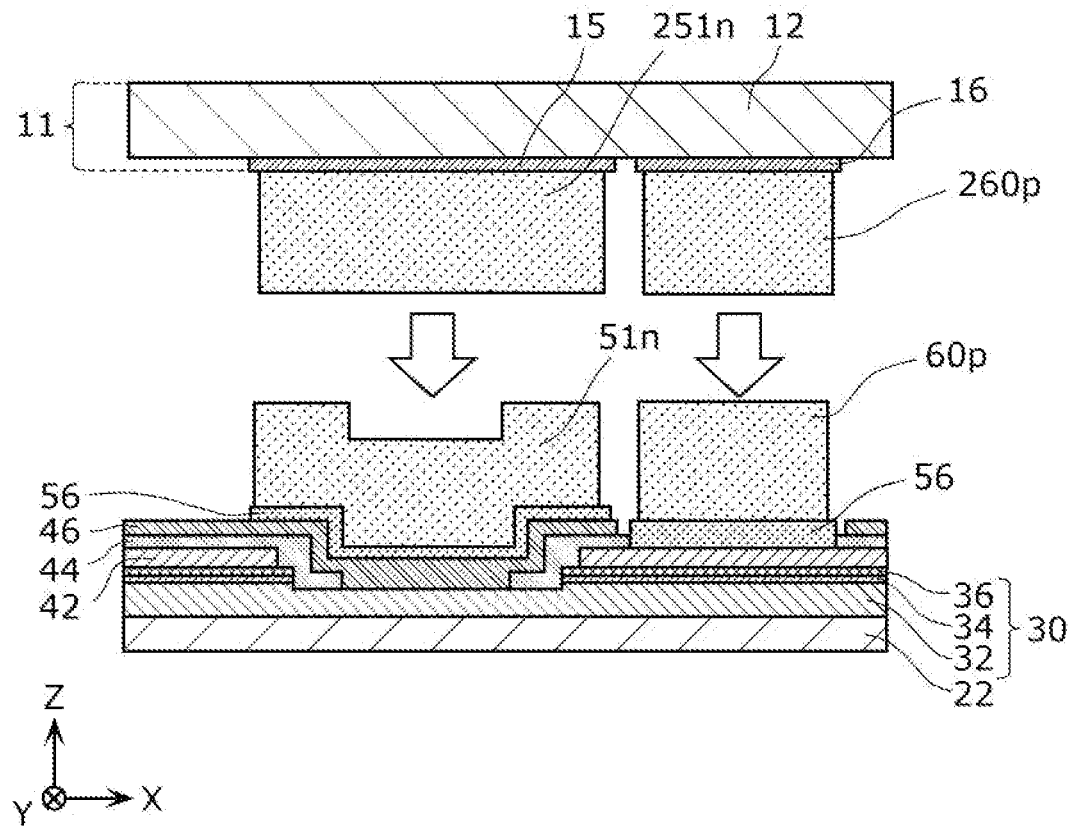
FIG. 28B is a schematic cross-sectional view illustrating a second process in the manufacturing method of the semiconductor light-emitting device according to Embodiment 4.
Figure 28C:
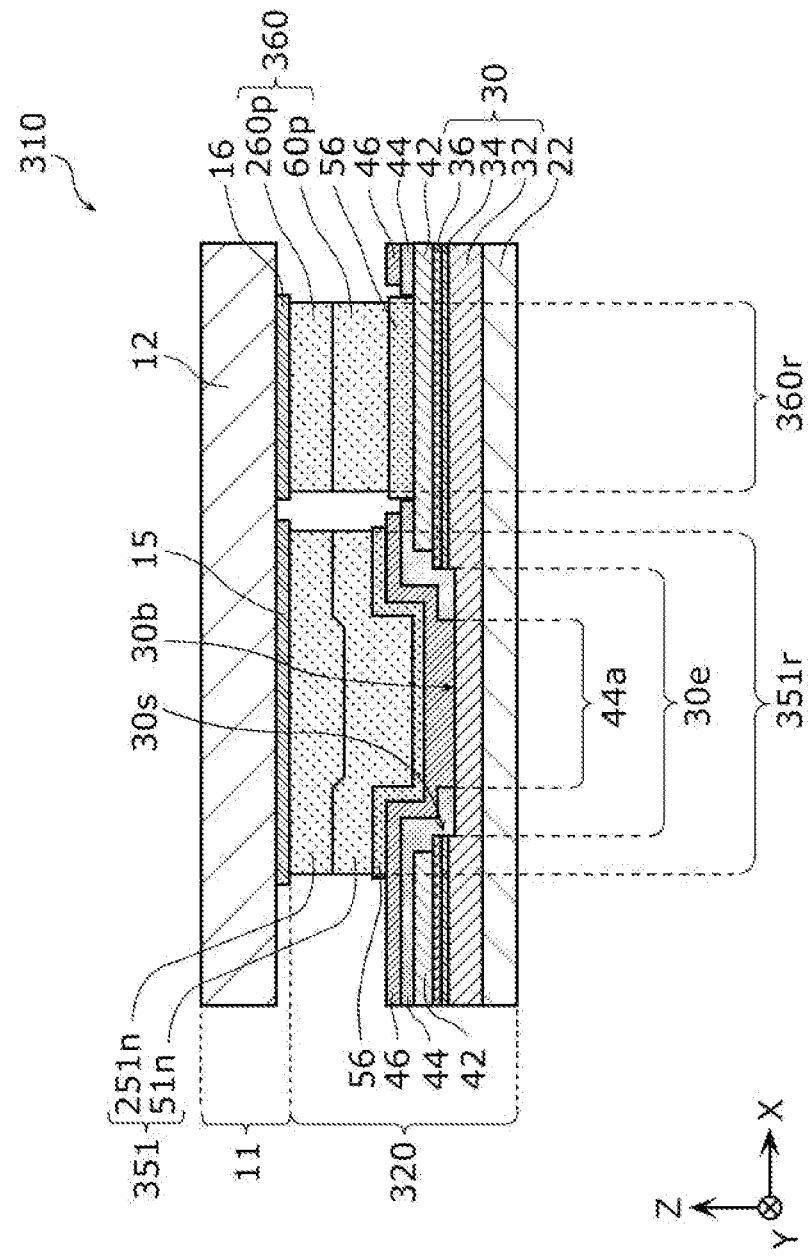
FIG. 28C is a schematic cross-sectional view illustrating a third process in the manufacturing method of the semiconductor light-emitting device according to Embodiment 4.

Next, a method of manufacturing semiconductor light-emitting device 310 according to this embodiment will be described with reference to FIG. 28A through FIG. 28C. FIG. 28A through FIG. 28C are each a schematic cross-sectional view illustrating a process in the manufacturing method of semiconductor light-emitting device 310 according to this embodiment.

As is the same as in the manufacturing method of semiconductor light-emitting device 10 according to Embodiment 1, first, semiconductor stack 30, p wiring electrode layer 42, insulating layer 44, n wiring electrode layer 46, seed metal layer 56, at least one element-side n connecting member 51n, and element-side p connecting member 60p are sequentially formed on growth substrate 22, as illustrated in FIG. 28A. At least one first n terminal region 351r, which is a region in which a conductive member for electric connection to an external conductor is to be disposed, is set above n wiring electrode layer 46. In addition, p terminal region 360r, which is a region in which a conductive member for electric connection to an external conductor is to be disposed, is set above p wiring electrode layer 42. Subsequently, at least one element-side n connecting member 51n and element-side p connecting member 60p are formed in at least one first n terminal region 351r above n wiring electrode layer 46 and in p terminal region 360r above p wiring electrode layer 42, respectively.

Subsequently, mounting board 11 is prepared, as illustrated in FIG. 28B. In this embodiment, at least one mounting-board-side n connecting member 251n and mountingboard-side p connecting member 260p are formed on first wiring electrode 15 and second wiring electrode 16 of mounting board 11, respectively, as in the manufacturing method of semiconductor light-emitting device 210 according to Embodiment 3.

Subsequently, at least one mounting-board-side n connecting member 251n and mounting-board-side p connecting member 260p which are formed on mounting board 11 are bonded to at least one element-side n connecting member 51n and element-side p connecting member 60p, respectively. With this, at least one first n connecting member 351 and p connecting member 360 are formed, as illustrated in FIG. 28C. First n connecting member 351 includes a pair of element-side n connecting member 51n and mounting-board-side n connecting member 251n, and p connecting member 360 includes a pair of element-side p connecting member 60p and mounting-board-side p connecting member 260p.

Semiconductor light-emitting element 320 and semiconductor light-emitting device 310 according to this embodiment are manufactured as described above.

Variations, Etc.

Although the semiconductor light-emitting element and the semiconductor light-emitting device according to the present disclosure have been described above based on each of the embodiments and variations thereof, the present disclosure is not limited to the aforementioned embodiments and variations thereof.

For example, in each of the aforementioned embodiments and variations thereof, a first n terminal region that is set above n wiring electrode layer 46 coincides with a region in which a first n connecting member is to be disposed and which is set above n wiring electrode layer 46, but these regions do not have to coincide with each other. For example, the first n connecting member does not need to be disposed over the entire first n terminal region, and part of the first n connecting member may be disposed in a region other than the first n terminal region.

In the state before at least one first n connecting member, at least one second n connecting member, and a p connecting member are disposed on a semiconductor light-emitting element, at least one first n terminal region, at least one second n terminal region, and a p terminal region which have been set may be marked on an n wiring electrode layer and a p wiring electrode layer of the semiconductor light-emitting element or indicated in the specification of the semiconductor light-emitting element.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor light-emitting element and the semiconductor light-emitting device according to the present disclosure are applicable, for example, to projectors as high-output and highly-efficient light sources.

The invention claimed is:

1. A semiconductor light-emitting element, comprising:
a semiconductor stack including an n-type layer, a light-emitting layer above the n-type layer, and a p-type layer above the light-emitting layer, the semiconductor stack having at least one n exposure portion which is a recess at which the n-type layer is exposed;
a p wiring electrode layer on the p-type layer;
an insulating layer that (i) continuously covers inner lateral surfaces of the at least one n exposure portion and part of a top surface of the p wiring electrode layer and (ii) has an opening portion that exposes the n-type layer at a bottom surface of the at least one n exposure portion;
an n wiring electrode layer disposed above the p-type layer and the p wiring electrode layer via the insulating layer, the n wiring electrode layer being in contact with the n-type layer in the opening portion; and
at least one first n connecting member that is a conductive member for electric connection to an external conductor, wherein:
the at least one first n connecting member is a bump made of one of Au, Ag, Al, and Cu or an alloy made of a combination of at least two of Au, Ag, Al, and Cu, and is connected to the n wiring electrode layer in at least one first n terminal region,
in a plan view, the at least one first n terminal region includes at least a portion of a region above the opening portion,
the n wiring electrode layer and the p-type layer are disposed below the at least one first n terminal region in a cross section parallel to a stacking direction of the semiconductor stack, and
a grain size of the at least one first n connecting member is larger than a grain size of the n wiring electrode layer.

2. The semiconductor light-emitting element according to claim 1, further comprising:
at least one second n connecting member that is a conductive member for electric connection to an external conductor, wherein
the at least one second n connecting member is connected to the n wiring electrode layer in at least one second n terminal region for the n wiring electrode layer disposed in a location other than the at least one n exposure portion.

3. The semiconductor light-emitting element according to claim 2, wherein
the at least one first n connecting member is disposed apart from the at least one second n connecting member.

4. The semiconductor light-emitting element according to claim 1, further comprising:
a p connecting member in a region of the p wiring electrode layer, the region being exposed from the n wiring electrode layer and the insulating layer; and
a seed metal layer between the at least one first n connecting member and the n wiring electrode layer and between the p connecting member and the p wiring electrode layer, the seed metal layer having a surface that is facing away from the semiconductor stack and is made of Au, wherein
the at least one first n connecting member and the p connecting member are made of Au.

5. The semiconductor light-emitting element according to claim 1, further comprising:
a p connecting member in a region of the p wiring electrode layer, the region being exposed from the n wiring electrode layer and the insulating layer; and
a void enclosed by the at least one first n connecting member and the n wiring electrode layer.

6. The semiconductor light-emitting element according to claim 1, further comprising:

a p connecting member in a region of the p wiring electrode layer, the region being exposed from the n wiring electrode layer and the insulating layer, wherein:
the at least one first n connecting member includes a pair of an element-side n connecting member and a mounting-board-side n connecting member,
the p connecting member includes a pair of an element-side p connecting member and a mounting-board-side p connecting member,
the element-side n connecting member is disposed closer to the semiconductor stack than the mounting-board-side n connecting member is, and
the element-side p connecting member is disposed closer to the semiconductor stack than the mounting-board-side p connecting member is.

7. The semiconductor light-emitting element according to claim 1, wherein
in a plan view of the n wiring electrode layer, a total area of the at least one first n terminal region is larger than a total area of the n wiring electrode layer disposed in a location other than the at least one n exposure portion.

8. The semiconductor light-emitting element according to claim 1, wherein
in a plan view of the n wiring electrode layer, an area of the at least one first n terminal region is larger with closeness to an edge portion of the semiconductor light-emitting element.

9. The semiconductor light-emitting element according to claim 1, wherein
in a plan view of the n wiring electrode layer, an area of the opening portion is larger with closeness to an edge portion of the semiconductor light-emitting element.

10. The semiconductor light-emitting element according to claim 1, wherein
in a plan view of the n wiring electrode layer, a center of the at least one first n terminal region is placed in a region of the opening portion.

11. The semiconductor light-emitting element according to claim 1, wherein
in a plan view of the n wiring electrode layer, a center of the at least one first n terminal region coincides with a center of the opening portion.

12. The semiconductor light-emitting element according to claim 7, wherein
at least one second n terminal region is set above the n wiring electrode layer disposed in a location other than the at least one n exposure portion, the at least one second n terminal region being a region in which a conductive member for electric connection to an external conductor is to be disposed.

13. The semiconductor light-emitting element according to claim 2, wherein
in a plan view of the n wiring electrode layer, a total sum of areas of the at least one first n terminal region and the at least one second n terminal region is greater than a total area of the n wiring electrode layer disposed in a location other than the at least one n exposure portion.

14. The semiconductor light emitting element according to claim 12, wherein
in a plan view of the n wiring electrode layer, a total sum of areas of the at least one first n terminal region and the at least one second n terminal region is greater than a total area of the n wiring electrode layer disposed in a location other than the at least one n exposure portion.

15. A semiconductor light-emitting device, comprising:
a semiconductor light-emitting element; and
a mounting board including a first wiring electrode and a second wiring electrode, wherein:
the semiconductor light-emitting element comprises:
a semiconductor stack including an n-type layer, a light-emitting layer above the n-type layer, and a p-type layer above the light-emitting layer, the semiconductor stack having at least one n exposure portion which is a recess at which the n-type layer is exposed;
a p wiring electrode layer on the p-type layer;
an insulating layer that (i) continuously covers inner lateral surfaces of the at least one n exposure portion and part of a top surface of the p wiring electrode layer and (ii) has an opening portion that exposes the n-type layer at a bottom surface of the at least one n exposure portion;
an n wiring electrode layer disposed above the p-type layer and the p wiring electrode layer via the insulating layer, the n wiring electrode layer being in contact with the n-type layer in the opening portion; and
at least one first n connecting member that is a conductive member for electric connection to an external conductor,
the at least one first n connecting member is a bump made of one of Au, Ag, Al, and Cu or an alloy made of a combination of at least two of Au, Ag, Al, and Cu, and is connected to the n wiring electrode layer in at least one first n terminal region,
in a plan view, the at least one first n terminal region includes at least a portion of a region above the opening portion,
the n wiring electrode layer and the p-type layer are disposed below the at least one first n terminal region in a cross section parallel to a stacking direction of the semiconductor stack,
the at least one first n connecting member is bonded to the first wiring electrode of the mounting board,
the p wiring electrode layer is bonded, in a region, to the second wiring electrode of the mounting board via a p connecting member that is a conductive member, the region being exposed from the n wiring electrode layer and the insulating layer, and
in the cross section parallel to the stacking direction, a grain size of the at least one first n connecting member above the opening portion is larger than a grain size of the at least one first n connecting member above the p-type layer.

16. The semiconductor light-emitting device according to claim 15, wherein
an edge portion of a bonding face, of the at least one first n connecting member, at which the at least one first n connecting member is bonded to the first wiring electrode of the mounting board, is located inward of the first wiring electrode and away from an edge portion of the first wiring electrode.

17. A semiconductor light-emitting device, comprising:
a semiconductor light-emitting element; and
a mounting board including a first wiring electrode and a second wiring electrode, wherein:
the semiconductor light-emitting element comprises:
a semiconductor stack including an n-type layer, a light-emitting layer above the n-type layer, and a p-type layer above the light-emitting layer, the semiconductor stack having at least one n exposure portion which is a recess at which the n-type layer is exposed;
a p wiring electrode layer on the p-type layer;
an insulating layer that (i) continuously covers inner lateral surfaces of the at least one n exposure portion and part of a top surface of the p wiring electrode layer and (ii) has an opening portion that exposes the n-type layer at a bottom surface of the at least one n exposure portion;

an n wiring electrode layer disposed above the p-type layer and the p wiring electrode layer via the insulating layer, the n wiring electrode layer being in contact with the n-type layer in the opening portion; and at least one first n connecting member that is a conductive member for electric connection to an external conductor, the at least one first n connecting member is a bump made of one of Au, Ag, Al, and Cu or an alloy made of a combination of at least two of Au, Ag, Al, and Cu, and is connected to the n wiring electrode layer in at least one first n terminal region, in a plan view, the at least one first n terminal region includes at least a portion of a region above the opening portion, the n wiring electrode layer and the p-type layer are disposed below the at least one first n terminal region in a cross section parallel to a stacking direction of the semiconductor stack, the at least one first n connecting member is bonded to the first wiring electrode of the mounting board, the p wiring electrode layer is bonded, in a region, to the second wiring electrode of the mounting board via a p connecting member that is a conductive member, the region being exposed from the n wiring electrode layer and the insulating layer, and in the cross section parallel to the stacking direction, an outer shape of the at least one first n connecting member has a wide bottom shape that widens from a first wiring electrode layer side toward an n wiring electrode layer side.

18. The semiconductor light emitting device according to claim 17, wherein in the cross section parallel to the stacking direction, a grain size of the at least one first n connecting member above the opening portion is larger than a grain size of the at least one first n connecting member above the p-type layer.

\* \* \* \* \*